(12) United States Patent  
Nozu

(10) Patent No.: US 6,696,831 B2  
(45) Date of Patent: Feb. 24, 2004

(54) TESTING APPARATUS AND METHOD FOR TESTING MAGNETIC HEAD AND/OR MAGNETIC DISK

(75) Inventor: Takashi Nozu, Kanagawa (JP)

(73) Assignee: International Manufacturing and Engineering Services Co., Ltd., Kanagawa-ken (JP)

( * ) Notice: Subject to any disclaimer, the term of this patent is extended or adjusted under 35 U.S.C. 154(b) by 88 days.

(21) Appl. No.: 09/951,042

(22) Filed: Sep. 12, 2001

(65) Prior Publication Data

US 2002/0050814 A1 May 2, 2002

(30) Foreign Application Priority Data

Sep. 13, 2000 (JP) ........................................ 2000-277893

(51) Int. Cl.[7] .............................................. G01R 33/12
(52) U.S. Cl. ....................................... 324/210; 324/212
(58) Field of Search ................................. 324/210–212; 360/75–78.15, 31, 110

(56) References Cited

U.S. PATENT DOCUMENTS

| | | | | |
|---|---|---|---|---|
| 3,812,529 A | * | 5/1974 | Yoichi | 360/25 |
| 4,638,384 A | * | 1/1987 | Stewart et al. | 360/77.05 |
| 4,725,902 A | * | 2/1988 | Oda et al. | 360/66 |
| 4,978,916 A | * | 12/1990 | Combettes et al. | 324/212 |
| 5,257,255 A | * | 10/1993 | Morimoto et al. | 369/53.42 |
| 6,006,614 A | | 12/1999 | Guzik | 73/865.6 |
| 6,023,145 A | | 2/2000 | Karaaslan et al. | 318/652 |
| 6,118,608 A | * | 9/2000 | Kakihara et al. | 360/53 |
| 6,144,516 A | * | 11/2000 | Takeda et al. | 360/75 |
| 6,359,746 B1 | * | 3/2002 | Kakekado et al. | 360/75 |

* cited by examiner

Primary Examiner—N. Le
Assistant Examiner—Reena Aurora
(74) Attorney, Agent, or Firm—McCormick, Paulding & Huber LLP

(57) ABSTRACT

A testing apparatus for a magnetic head or a magnetic disk, includes a magnetic disk; a magnetic head moving mechanism which holds a magnetic head and which moves the magnetic head to a predetermined position in a radial direction of the magnetic disk; a movement mechanism control device for driving the magnetic head moving mechanism, wherein the movement mechanism control device moves the magnetic head moving mechanism to a predetermined radial position corresponding to position data; a read/write control device for writing a predetermined magnetic signal on the magnetic disk using the magnetic head, and for reading a magnetic signal of the magnetic disk using the magnetic head; and a memory for storing therein position data embedded in a data surface of the magnetic disk, extracted from the magnetic signal which is read by the read/write control device. A testing method is also disclosed.

11 Claims, 20 Drawing Sheets

Fig. 5

| | Read Signal | WR | SSM | SID | A | B | C | D | SECID | Data Area |
|---|---|---|---|---|---|---|---|---|---|---|
| 1 | | | | | | | | | | |
| 2 | Search SSM | ■ | | | | | | | | |
| 3 | SSM Detected | | ■ | | | | | | | |
| 4 | SSM Clocking | | ■ | | | | | | | |
| 5 | Read SID | | | ■ | | | | | | |
| 6 | Burst-A-Time | | | | ■ | | | | | |
| 7 | Burst-B-Time | | | | | ■ | | | | |
| 8 | Burst-C-Time | | | | | | ■ | | | |
| 9 | Burst-D-Time | | | | | | | ■ | | |
| 10 | Generate PS PS: Position Signal | | | | | | | | ■ | |
| 11 | Swing PS | | | | | | | | ■ | |
| 12 | Read SECID | | | | | | | | ■ | |
| 13 | Process DATA (Read or Write) | | | | | | | | | ■ |

TESTING APPARATUS AND METHOD FOR TESTING MAGNETIC HEAD AND/OR MAGNETIC DISK

BACKGROUND OF THE INVENTION

1. Field of the Invention

The present invention relates to a magnetic head/disk testing apparatus (which is referred to hereinafter as a head tester) for testing a magnetic head and/or a magnetic disk, both being significant functional parts of a magnetic disk drive or magnetic disk storage device. The present invention also relates to a method for testing a magnetic head/disk.

2. Description of the Related Art

A magnetic disk storage device (which is referred to hereinafter as an HDD) is a mass storage random access memory device in which digital data is written on or read from a magnetic disk medium (platter) which rotates at high speed, by a magnetic head which is located above and close to the magnetic disk medium. In recent years, HDDs have been miniaturized so as to achieve dramatically increased storage data capacity in order to meet demands of a technetronic society and as a result of technological competition. An increase in the storage capacity for the same shape and size can be achieved by increasing the magnetic recording density of the magnetic disk medium.

The magnetic recording density (areal density: Gbpsi (gigabits per square inch)) is the product of the linear density (density in the circumferential direction: bpi (bit per inch)) and the track density (density in the radial direction: TPI (track per inch)). The magnetic recording density of a typical HDD at present is approximately 10 Gbpsi (=500K bpi (linear density)×20K TPI (track density). However, the current target recording density is 100 Gbpsi, and it is expected that the recording density will be increased to approximately 1000 Gbpsi in the near future. In the so-called 'horizontal magnetic recording technology', the linear density is coming to its limit due to thermally induced self-demagnetization phenomenon and the like. Therefore, attempts have been made to increase the track density. For example, if the track density of 20K TPI is increased to the value of the linear density, i.e., approximately 500K TPI, the areal density would be increased 25 times, i.e., to approximately 250 Gbpsi.

A head tester is composed of a spin stand and an analyzer. In order to simulate the head working environment within HDDs, the spin stand is equipped with an extremely high precision air bearing spindle motor to rotate the disk medium, and a test head holding and positioning mechanism. The analyzer generates and writes the data, and reads the data back for signal analysis.

However, the currently available head testers cannot satisfactorily cope with recent advancements in HDD technology, for example, the increasing bit rate, and the radial positioning accuracy in testing very narrow width heads.

While HDDs employ embedded servo technology (or sector servo technology) in order to accurately position the heads on tracks, the spin stand in the conventional head testers rely on the mechanical accuracy without using sector servo technology. However, such an approach is reaching a limit against the recent increase of HDD track density.

The relationship of the track density, the track pitch, the head track width, and the required positioning accuracy is shown below.

| Track Density | 50KTPI | 200KTPI | 500KTPI |
|---|---|---|---|
| Track Pitch | 500 nm | 125 nm | 50 nm |
| Head Track Width | 300 nm | 75 nm | 30 nm |
| Required Positioning Accuracy | 30 nm | 7.5 nm | 3 nm |

The main causes of positioning error of the magnetic head are:

(1-1) Aperiodic axis fluctuation of the spindle motor (NRRO: non-repeatable run-out).

(1-2) Positioning error of the magnetic head holding mechanism and the magnetic head itself due to vibration, etc.

(1-3) Vibration of the magnetic disk and the magnetic head due to air flow turbulence above the magnetic disk which rotates at a high speed.

In conventional magnetic head testers, attempts have been made to improve the positioning accuracy by combining a vibration-proof table, an air-bearing spindle motor, a piezo actuator, and an air flow straightening vane, etc.

Such a conventional solution, however, requires high cost and space and, furthermore, since the required accuracy level has increased, is reaching its limit in accuracy.

The accuracy limit achievable by the above described conventional solution is said to be 50 kTPI, and the test accuracy deteriorates as track density reaches this limit.

As an alternative solution, it is possible to utilize tracking control technology on a head tester by applying sector servo technology which is used in HDD products, although in practice such a head tester has not been provided on the market. Sector servo technology achieves high precision positioning by using a method wherein high precision track position data is written in advance on the magnetic disk at a designated format, and the written data is read every moment (read constantly) by the magnetic head being tested, in order to correct the positioning error (tracking control).

For that purpose, the following needs to be achieved:

(2-1) An accurate track position data writing function (servo track writing function); and (2-2) A rigid actuator for high speed tracking.

To meet the requirements stipulated in (2-1) and (2-2) above, the spin stand must be provided with a high precision servo track write function. Though a high precision air bearing spindle motor can be used in the spin stand, the tracking capability is limited in the spin stand due to the increased mass of head holding fixture. Due to these restrictions, the maximum achievable track density by utilizing tracking control technology by applying sector servo technology is approximately 200 kTPI.

SUMMARY OF THE INVENTION

The object of the present invention is to achieve a test method for magnetic head or magnetic disk having a dramatically improved test capability for very narrow track width head.

To achieve the above object, a testing apparatus is provided for a magnetic head or a magnetic disk, including a magnetic disk which rotates at a predetermined constant rotational speed; a magnetic head moving mechanism which holds a magnetic head and which moves the magnetic head to a predetermined position in a radial direction of the magnetic disk; a movement mechanism control device for driving the magnetic head moving mechanism, wherein the movement mechanism control device moves the magnetic head moving mechanism to a predetermined radial position corresponding to position data; a read/write control device for writing a predetermined magnetic signal on the magnetic disk using the magnetic head, and for reading a magnetic signal of the magnetic disk using the magnetic head; and a memory for storing therein position data embedded in a data surface of the magnetic disk, extracted from the magnetic signal which is read by the read/write control device.

The test method for magnetic disk or head of the present invention is characterized by a magnetic disk that rotates in a predetermined constant speed, a magnetic head moving mechanism that holds and radially moves the head under test, a writing capability for servo track data on the disk, writing and reading capabilities of predetermined data to and from the disk at data field of the servo format, an extracting capability of position data from the read back signal, storing and reporting capabilities of the above extracted position data, and a method that compensates the test results using the above extracted and stored position data from the disk.

In an embodiment, the method is applied to a track profile test, the method including a pre-erasure step in which the magnetic head is moved to a predetermined test position in the radial direction by the magnetic head moving mechanism, so that each sector data in a predetermined test range of tracks of a predetermined format on the magnetic disk by the magnetic head which has been moved to the predetermined test position is erased, the erasure operations being repeatedly carried out at a plurality of positions while moving the magnetic head at a predetermined pitch in the radial direction; a signal writing step in which the magnetic head is moved to a substantially central position in the radial direction, of the test range which has been subjected to the erasure operation, so that a predetermined signal is written in the sector of the test range at the substantially central position; and a signal reading step in which the signal written in the sector in the predetermined test range is read while moving the magnetic head at a predetermined pitch, within a predetermined radial range on opposite sides of the substantially central position in the radial direction, through the magnetic head moving mechanism.

In an embodiment, the testing method including a pre-erasure step in which the magnetic head is moved to a predetermined test position in the radial direction by the magnetic head moving mechanism, so that each sector data in a predetermined test range of tracks of a predetermined format on the magnetic disk by the magnetic head which has been moved to the predetermined test position is erased, the erasure operations being repeatedly carried out at a plurality of positions while moving the magnetic head at a predetermined pitch in the radial direction; a signal writing step in which the magnetic head is moved to a target position in the radial direction, of the test range which has been subjected to the erasure operation, so that a low frequency signal is written in the sectors of the test range; a low frequency signal reading step in which the low frequency signal written in the sectors in the predetermined test range is read by the magnetic head which is moved through the magnetic head moving mechanism to a position which is determined taking into account the target position and a read/write offset of the magnetic head, wherein the amplitude of the read low frequency signal is stored in the memory; a high frequency signal writing step in which the magnetic head is moved by the magnetic head moving mechanism to a position which is determined taking into account the target position and the read/write offset of the magnetic head to write the high frequency signal in the sectors within the predetermined test range; a high frequency signal reading step in which the high frequency signal written in the predetermined test range is read by the magnetic head which is moved through the magnetic head moving mechanism to a position which is determined taking into account the target position and a read/write offset of the magnetic head; and a data selection step in which effective sectors are selected based on the position data of the signal read at each of the signal reading steps.

In an embodiment, the pre-erasure step includes checking whether the pre-erasure is valid, by successively marking the radial areas which have been subjected to erasure, for the circumferential area of each sector of the measurement range included in the test area which has been subjected to the pre-erasure included in the test range, based on the position data stored at each erasure step; and erasing the radial area by moving the magnetic head to the radial area which is not valid in the case where the pre-erasure of the radial area is not invalid.

In an embodiment, the pre-erasure step includes checking whether the radial areas that have been subjected to erasure overlap, for the circumferential area of each sector of the measurement range included in the test area which has been subjected to the pre-erasure included in the test range, based on the position data stored at each erasure step; and wherein in the case where the radial areas overlap, the radial areas are deemed to be one radial area; and in the case where the circumferential data areas of the sectors within the measurement area are not integrated into one radial erasure area, the magnetic head is moved to an area between the radial areas which do not overlap, so that a predetermined signal is written in the radial area to thereby integrate the circumferential data areas of the sectors within the measurement area into one radial erasure area.

In an embodiment, when the read/write operation of the data from/on the magnetic disk by the magnetic head is carried out by the magnetic head, the magnetic head moving mechanism is driven to move and follow the magnetic head so that the position information embedded in the data surface, read and extracted from the magnetic disk by the magnetic head is identical to a predetermined target position.

In an embodiment, wherein the signal reading step includes moving the magnetic head in one of cyclically and irregularly in the radial direction by providing a predetermined swing to the magnetic head moving mechanism.

In an embodiment, the testing method further includes a calculation step to obtain a radial deviation between the writing operation and the reading operation, based on the position information of the magnetic head which has been judged to be valid in the pre-erasure validity checking operation and the read signal information corresponding to the magnetic head position information.

In an embodiment, the testing method includes servo-writing the data on the magnetic disk which rotates at a speed at which aperiodic position error is minimized, via one of a reference clock magnetic head and the writing magnetic head, in a predetermined range larger than the radial test area the magnetic disk, prior to the pre-erasure step.

In an embodiment, the magnetic head includes a plurality of magnetic heads in the form of a head stack assembly.

The present disclosure relates to subject matter contained in Japanese Patent Application No. 2000-277893 (filed on Sep. 13, 2000) which is expressly incorporated herein by reference in its entirety.

BRIEF DESCRIPTION OF THE DRAWINGS

The invention will be discussed below with reference to the accompanying drawings, in which:

FIG. 5 is a timing chart for reading sectors of a magnetic disk shown in FIG. 4;

DESCRIPTION OF THE PREFERRED EMBODIMENT

The format structure of an HDD to which the invention is applied will be explained with reference to FIGS. 1, 3, 4 and 5.

<Writing Position Information (Servo Information) in an HDD Manufacturing Process (Servo Track Writing)>

In the HDD, the following magnetic head positioning method is adopted. Upon completion of the assembly of the HDD, after the basic functions of each element are confirmed, servo-track writing is carried out to write position information (servo information) on all the tracks of all the surfaces of the magnetic disks (in general, a plurality of magnetic disks), using a servo-track writer. One track is divided into several tens of servo sectors. One servo sector is provided with a servo area at its leading end and the remaining areas define data areas which are used for storing the data. Such partitioned usage of a track is referred to as an entire track format or a sector format. A typical track format is shown in FIG. 4.

Figure 4:
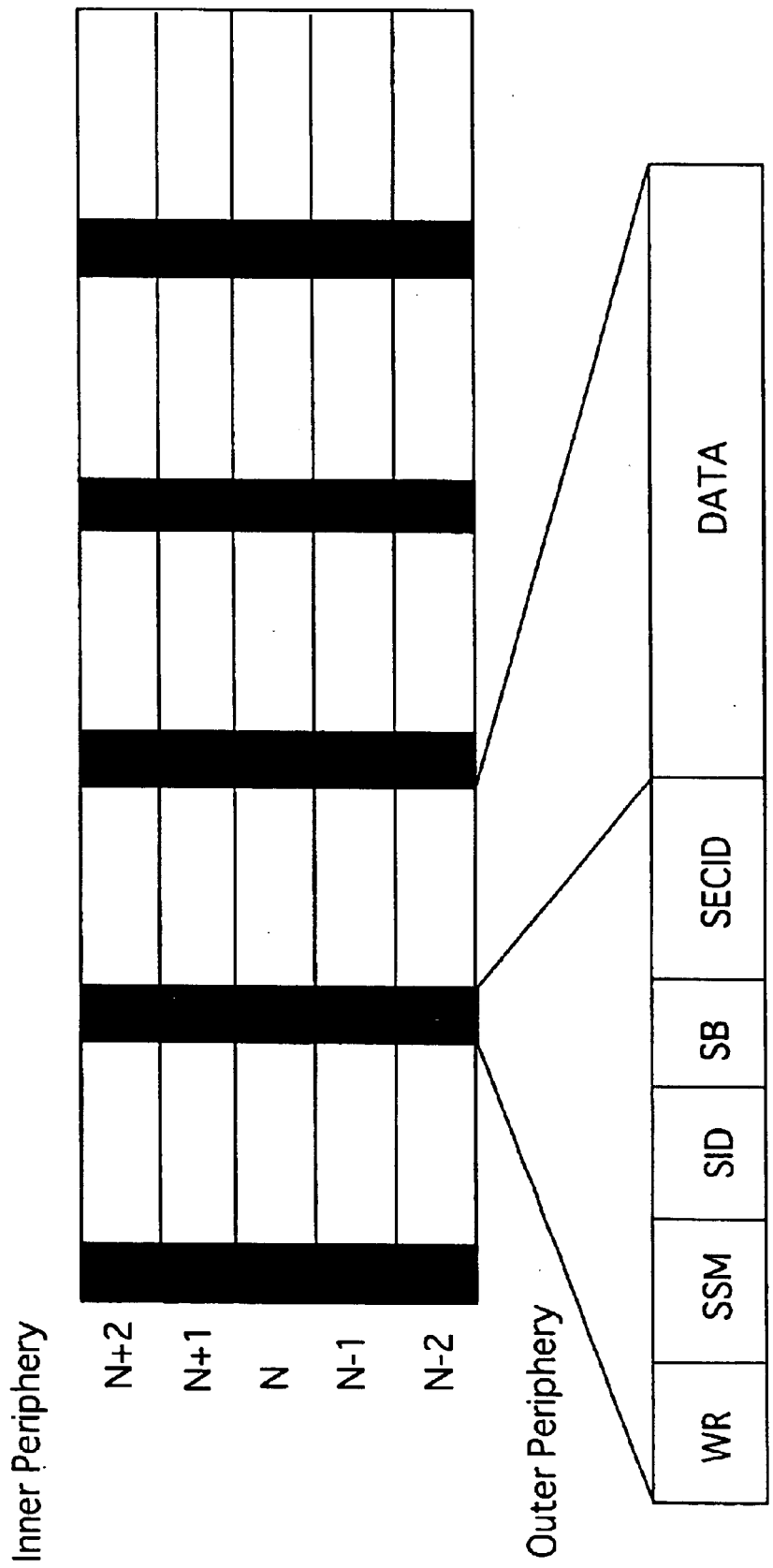
FIG. 4 is a view of an example of a format of a magnetic disk.

In FIG. 4, the arched tracks formed on a magnetic disk (magnetic disk medium/platter) 111 and the sector format are schematically shown as in linear track expression in the horizontal direction. If a magnetic head 121 is positioned over a track N, the signals on the track N is read from left to right. FIG. 4 also shows details of the divided areas of one servo sector. Each servo sector consists of the servo area and the data area. The servo area consists of the following sub areas.

WR (Write Recovery Field): Area which provides preparation time from the writing mode to the servo area reading when data is written.

SSM (Servo Start Mark): Marker area which indicates the beginning of the servo area.

SID (Servo Identification Field): Area in which the track number or cylinder number is recorded.

SB (Servo Burst Field): Area in which the analogue position signal is recorded.

SECID (Sector Identification Field): Area in which the sector number is recorded.

DATA (Data Field): Area in which the user data is recorded.

In the track/cylinder number area SID, data is written in a numerical expression method called a Gray code, so that the data can be correctly read during the movement of the magnetic head 121 in the disk radial direction (upward and downward direction with respect to FIG. 4). In the analogue position signal area SB, data can be written in various methods, however the current prevailing method is to divide the analogue position signal area SB into four time areas in which data is written with a phase difference in the radial direction, so that two-phase analogue position data is obtained, based on four amplitude data. This system generates two phase signals like that of an optical position encoder. In the illustrated embodiment, the position data of the magnetic head 121 is obtained by combining data of the track/cylinder number area SID and the analogue position signal area SB which are read by the magnetic head 121.

<Positioning Mechanism and Format Control During Reading/Writing Operation>

The magnetic head 121 which flies above the rotating magnetic disk 111 is position-controlled in accordance with the position information of the servo area, while continuously reading the servo information written in the track format. The head positioning control includes a seeking operation to move the magnetic head 121 to a target track and a track following operation to subsequently trace the track. The position control method in which the data is read from and written in the data area, while reading the servo area information is referred to as a "format control" which is carried out by a format controller 14 (see FIG. 1).

Figure 3:
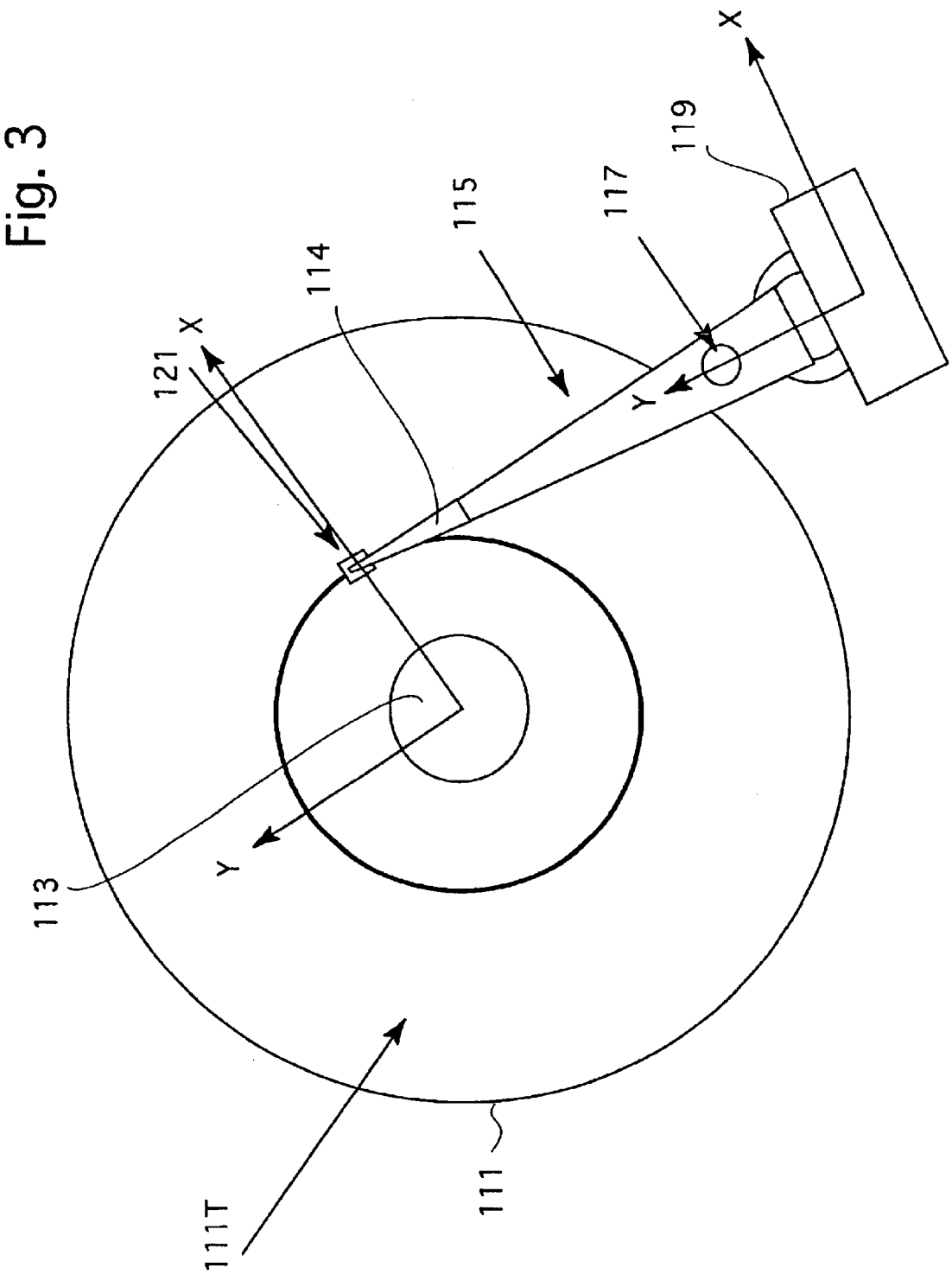
FIG. 3 is a schematic view of a spin stand in a testing apparatus shown in FIG. 1.

A testing apparatus and test method, according to the present invention, to test (measure) the magnetic head 121 or magnetic disk 111 for the HDD will be discussed below with reference to FIGS. 1 and 3.

The spin stand 11 is provided with the magnetic disk 111, an air-bearing spindle motor 113 for rotating the magnetic disk 111, an arm 115 which is provided on its front end with a magnetic head attachment and detachment mechanism 114 and which moves the magnetic head 121 which is to be tested, attached to the magnetic head attachment and detachment mechanism 114, in the X-Y axis directions to a predetermined radial position, and an actuator 119 which rotates the arm about a pivot shaft 117 to thereby move the magnetic head 121 in the radial direction of the magnetic disk 111. The actuator 119 has a function to move the arm 115, i.e., the magnetic head 121 which is to be tested, to a designated radial position or to move the magnetic head 121 in the radial direction at a designated pitch. The arm 115, the magnetic head attachment and detachment mechanism 114, the actuator, and the pivot shaft 117 constitute a magnetic head moving mechanism.

Figure 1:
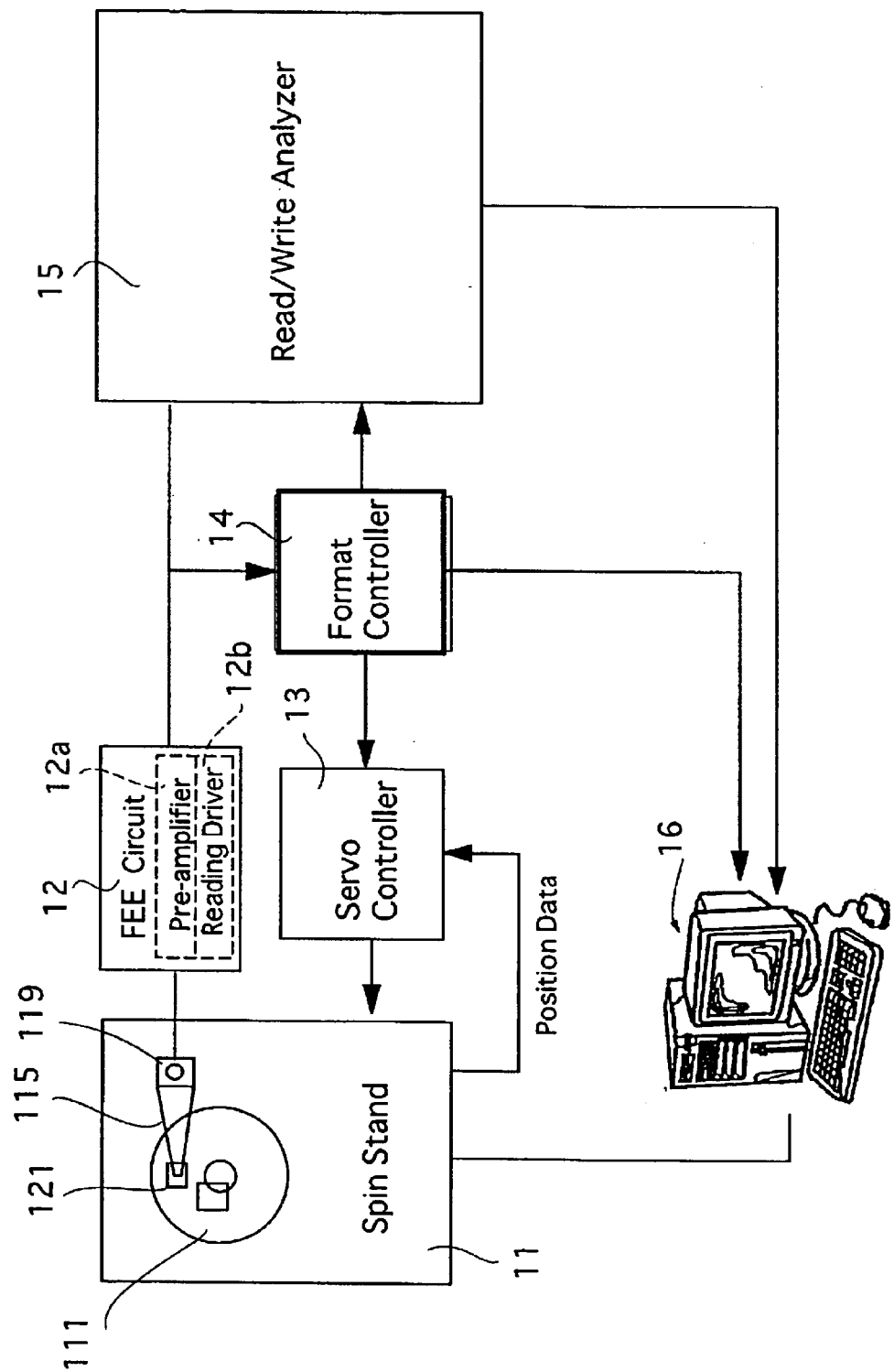
FIG. 1 is block diagram of a testing apparatus for carrying out a method for testing a magnetic head for a magnetic disk drive, according to an embodiment of the invention.

In the illustrated embodiment, as shown in FIG. 1, the actuator 119 is driven by a computer, e.g., a personal computer (movement mechanism control device) 16, to move the magnetic head 121 which is to be tested in a designated radial direction at a predetermined pitch. Moreover, the magnetic head 121 in the illustrated embodiment is a GMR (giant magneto-resistive) head having independent read and write heads (not shown).

A FEE (Front-end Electronics) 12 is provided with a preamplifier 12a and a writing driver 12b and constitutes an electric interface to read and write the data from the magnetic disk 111 by the magnetic head 121.

The preamplifier 12a amplifies a feeble signal output from the magnetic head 121 which reads the data from the magnetic disk 111. The amplified signal is supplied to the format controller 14 and the read/write analyzer (read/write control device) 15. The writing driver 12b constitutes an amplifier which amplifies the data signal to write the data signal output from the read/write analyzer 15 on the magnetic disk 111 by the magnetic head (write head) 121. The FEE 12, which processes the micro signal or high-speed signal, must be located as close to the magnetic head 121 as possible. Accordingly, in general, the FEE 12 is located within the spin stand 11. The FEE 12 used in the illustrated embodiment is formed integral with the magnetic head 121.

The servo controller 13 controls the position of the magnetic head 121 on the spin stand 11. There are two kinds of position data to be referenced: position data output from the head positioning mechanism in the spin stand 11, i.e., the position data of the magnetic head 121 in the radial direction, and position data embedded in a data surface (PS: position signal) of the magnetic disk 111 read from the magnetic disk 111 via the format controller 14.

The format controller 14 extracts position data from the signals read by the magnetic head 121 and supplies these signals to the servo controller 13 and supplies the read/write timing signal for the data area to the read/write analyzer 15.

The timing chart of the format controller 14 to read the data in one sector is shown in FIG. 5 by way of example.

The format controller 14 has an inherent function to record the data of the position of the magnetic head 121 when the data is written on the magnetic disk 111 by the magnetic head 121 and to send the recorded position data to the personal computer 16, and an inherent function to give an intentional swing to the target position of the magnetic head 121.

The read/write analyzer 15 performs the signal processing necessary for the function test of the magnetic head 121, such as writing the data on the magnetic disk 111 via the FEE 12 and the magnetic head 121 in response to the command of the personal computer 16, and reading the written data from the magnetic disk 111, etc. The writing and reading of the data are carried out in synchronization with the timing signal output from the format controller 14.

The personal computer 16 controls the spin stand 11, the read/write analyzer 15, and the format controller 14 in accordance with input made by an operator, and performs the function test of the magnetic head 121, and the host reporting or the servo tracking (writing of the position data).

Figure 2:
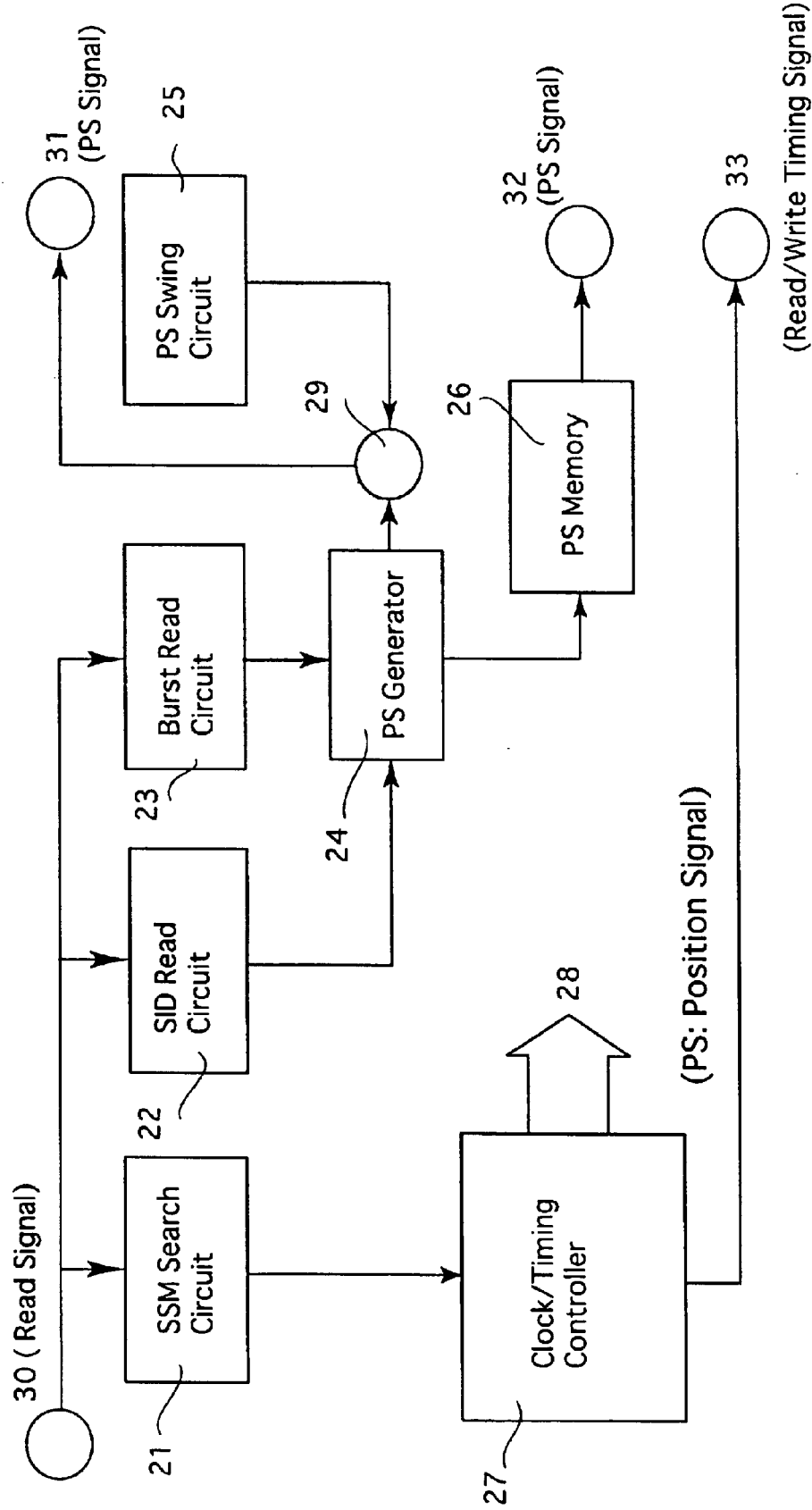
FIG. 2 is a block diagram of an embodiment of main components of a format controller in a testing apparatus shown in FIG. 1.

The details of the format controller 14 in the illustrated embodiment will be discussed below with reference to a block diagram shown in FIG. 2. In FIG. 2, the read signal 30 is obtained by amplifying the read signal output from the magnetic head 121 by the pre-amplifier 12a. The read signal 30 is input to each detection block, i.e., is input to a SSM search circuit 21, a SID reading circuit 22, and a burst reading circuit 23.

A PS' signal 31 represents analogue or digital position data, output from the adder 29 and supplied to the servo controller 13.

The PS signal 32 represents digital position data read from the PS memory 26 and supplied to the personal computer 16.

The read/write timing signal 33 represents timing data output from a clocking & timing controller 27 and supplied to the read/write analyzer 15.

The SSM search circuit 21 (Search SSM) detects the inherent data pattern of the marker area SSM and supplies the detected data pattern to the clocking & timing controller 27.

The SID reading circuit 22 (Read SID) separates data of the track/cylinder number area SID and supplies the separated track/cylinder number data to a PS generator 24.

The burst reading circuit 23 (Read Burst) generates the two-phase analogue position signal from the signal of the analogue position signal area SB of the read signal 30 and supplies the same to the PS generator 24.

The PS generator 24 generates position data, based on the data of the track/cylinder number area SID and the analogue position signal area SB.

A PS swing circuit (PS swinger) 25 generates random numbers or a repetition signal to add an intentional swing signal to the position signal PS and outputs the intentional swing signal to the adder 29.

The PS memory 26 stores the position signal PS for one revolution of the disk and supplies the stored position signal to the personal computer 16 as a PS position signal 32, in response to the command of the personal computer 16.

The clocking & timing controller 27 generates a control timing (system timing) signal 28 and the read/write timing signal 33 in the format controller 14, in accordance with the SSM detection timing signal and the read signal 30 from the SSM search circuit 21.

The adder 29 adds the swing signal supplied from the PS swing circuit 25 to the resultant PS' signal 31.

Among the above-described circuits and functions, the PS swing circuit 25 and the PS memory 26 are inherent to the embodiment of the present invention. Moreover, the SSM search circuit 21, the SID read circuit 22, the burst read circuit 23, the timing clock controller 27 are provided by hardware (electronic circuits). The PS generator 24, the PS swing circuit 25, the PS memory 26, and the adder 29 are provided by software, i.e., by a microprocessor, such as a digital signal processor (DSP) and predetermined microprograms.

The basic structure shown in FIG. 1 is similar to that of a conventional tracking control using the servo technology. The features of the present invention reside in the functions of the format controller 14 and in the entire test method. The functions of the format controller and the entire test method will be discussed below.

The functions of the format controller 14 are determined as follows:

(3-1) Extracting the sector timing from the read signal and supplying the read/write timing signal to the read/write analyzer 15.

(3-2) Extract the track position data from the read signal and supplying the track position data to the servo controller 13.

(3-3) Recording the track position data (positioning error data) at a predetermined sampling timing which is determined in accordance with the number of revolutions and the number of sectors, and transferring the track position data to the personal computer 16.

(3-4) Intentionally generating position deviation swing in the functions (3-1) through (3-4). The functions (3-1) and (3-2) are the same as those in the prior art, however, functions (3-3) and (3-4) are particular to the present invention.

In a conventional magnetic head testing method, the tracking control is carried out as accurate as possible; the read/write tests are carried out without confirming the positioning error (assuming that there is no positioning error); and in the measurement items (track profile test, etc.) which treat the position as a parameter, a number of measurements are repeated while varying the target position at a designated pitch.

In the magnetic head testing method of the present invention, a mode in which a positioning error of the magnetic head 121 is intentionally caused is provided in addition to the mode in which the tracking control is carried out as accurate as possible; the positioning error data (position data) is recorded when the magnetism on the magnetic disk 111 is pre-erased, data is written, and data is read so that measurements including the position data as a parameter is obtained; the positioning error swing is caused intentionally so that the test can be completed within the minimum disk rotations on the measurement items which treat the position as a parameter, e.g., in a track profile test; the tracking control is carried out as accurate as possible on measurement items which do not treat the position as a parameter, and only the measurements which meet specifications within a designated range are used and the remaining measurements are simply ignored.

<Equivalent High Precision Positioning Method>

To provide a high track density (TPI (Track per Inch)) in the HDD, it is necessary to use a magnetic head (121) having a small track width. To read the data written on a small-width track, it is necessary to position the magnetic head 121 with high precision. Recent magnetic heads are composed of independent read and write elements. When the characteristics of the magnetic head 121 are measured, in general, the data is written using a write element of the magnetic head 121 itself (self-writing), and the data is thereafter read back to be analyzed using a read element of the same head. Generally, since positional offset occurs between read and write elements due to design reasons and problems in manufacturing process, the offset value needs to be measured so that when the data is read, the head position can be shifted in the opposite direction by the measurement value.

To this end, in the embodiment of the invention, a test method and a test system in which the actual positional offset between write and read elements of the magnetic head 121 can be precisely measured are provided. Moreover, in an embodiment of the invention, a control method and a control system in which the read head element is precisely positioned directly on the track, on which the data to be read is written, using the read/write offset can be used together to test the magnetic head 121.

The test method using the test system will be discussed below. A "track profile test" for precisely measuring the read/write offset of the magnetic head 121 is known in the art. In the conventional track profile test, the data is written on the magnetic disk 111, and thereafter, the amplitude of the read signal is measured while gradually changing the radial head position, so that the read/write offset, the effective write width of the write head, and the effective read width of the read head are measured in accordance with the relationship between the position and amplitude. The conventional method has a drawback, namely, that the positioning accuracy deteriorates due to random shaking of the spindle motor (NRRO: non-repeatable run-out), vibration of the positioning mechanism, or swing upon writing the position data using the servo track writer. Consequently, the positioning accuracy in the conventional method is limited to approximately 10 nm, and the measurable track density when the read/write offset is measured with the positioning accuracy is limited to approximately 200 KTPI. The track pitch when the track density is 200 KTPI is 125 nm, and the write track width is approximately 90 nm.

<Equivalent High Precision Positioning Method in Track Profile Test>

In an embodiment of the invention, measurement or test method such as the track profile test can be carried out with higher precision using a spin stand of a conventional mechanical precision. The embodiment of the track profile test will be discussed below. In this embodiment, the entire operation and process including those of the spin stand 11 are controlled by the microcomputer 16. The test method of the embodiment can be applied to other test items in which the position value is used as a parameter. For instance, the test method can be applied to a bathtub curve test for obtaining a read bit error rate BER with respect to the positioning error.

FIG. 5 shows a flow chart of the equivalent high precision positioning method in a track profile test. Before the control enters this routine, the servo track writing should be carried out for at least one track, or preferably for plural tracks, while rotating the magnetic disk 111 at a constant speed. The servo writing may be carried out using a reference magnetic head or the magnetic head 121 being tested. Upon completion of the servo writing, the magnetic disk 111 is rotated at a constant speed corresponding to the rotational speed of the HDD where the head is to be mounted. In this condition, the following operation is performed, wherein the erasure step number is N and the read step number is M.

Step 1—Pre-Erasure

Figure 6:
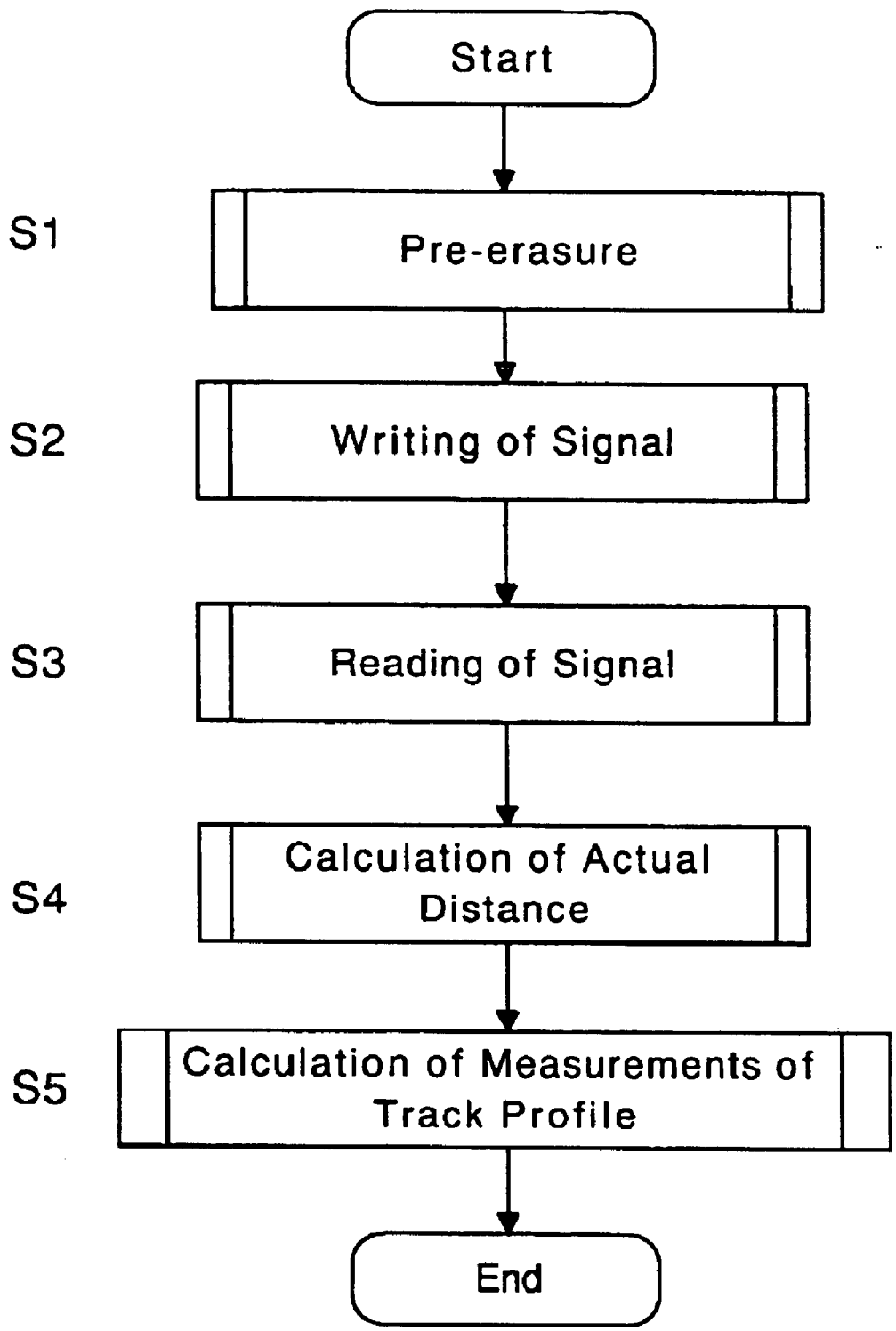
FIG. 6 is a flow chart of a first embodiment of a testing method, according to the present invention.

The data of the data area of each sector is erased while shifting the radial position of the magnetic head 121 for one test area on the pre-formatted magnetic disk 111 (step S1 of FIG. 6). At each erasure, the position data read from the magnetic disk 111 by the magnetic head 121 is recorded as PE (i, t) in the PS memory 26, wherein 'i' designates the erasure number, and 't' designates the sector number. This erasure is referred to as a "pre-erasure".

Figure 8:
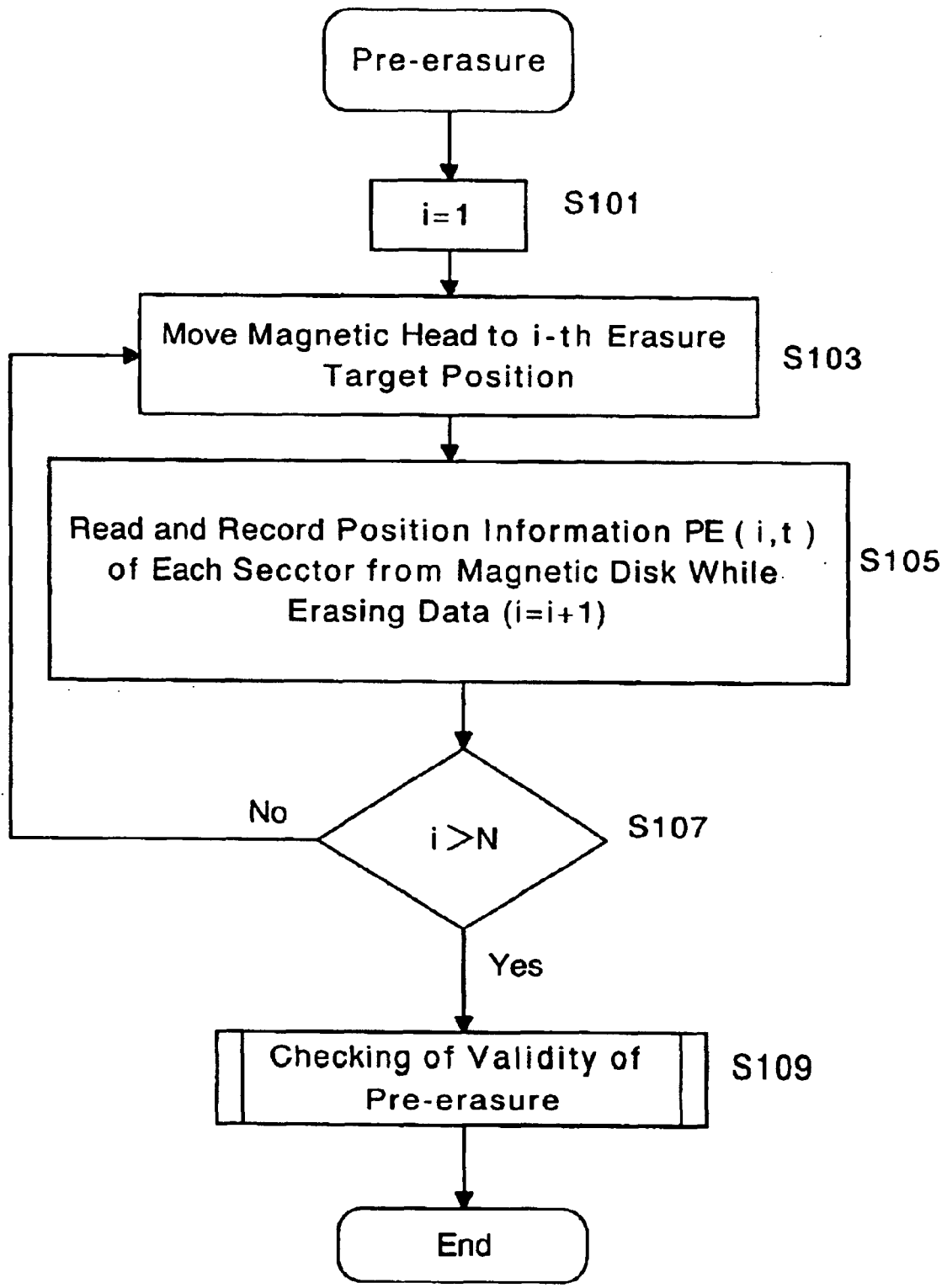
FIG. 8 is a flow chart of a pre-erasing operation in an embodiment of a testing method, according to the present invention.
Figure 9:
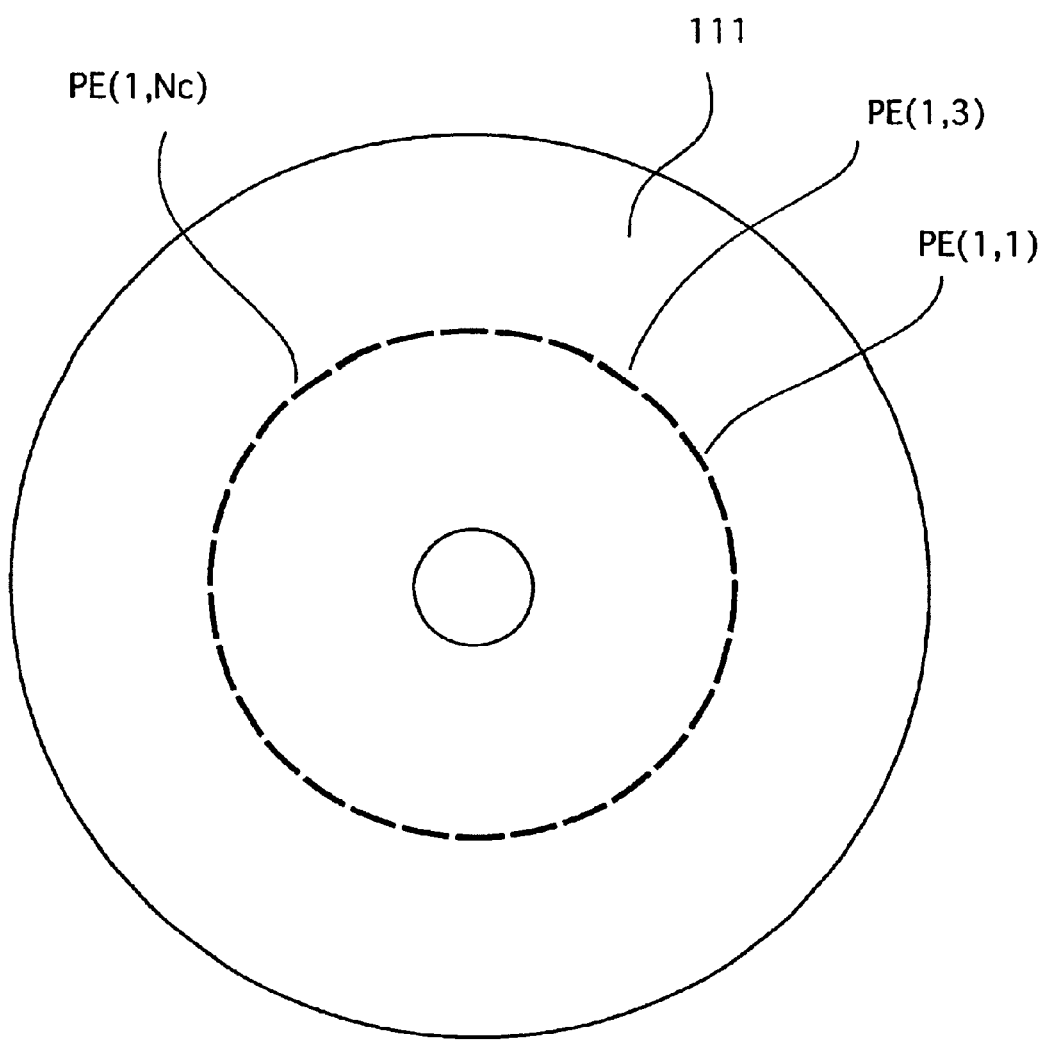
FIG. 9 is a view of pre-erased sector position data on a magnetic disk in an embodiment of a testing method, according to the present invention.
Figure 10:
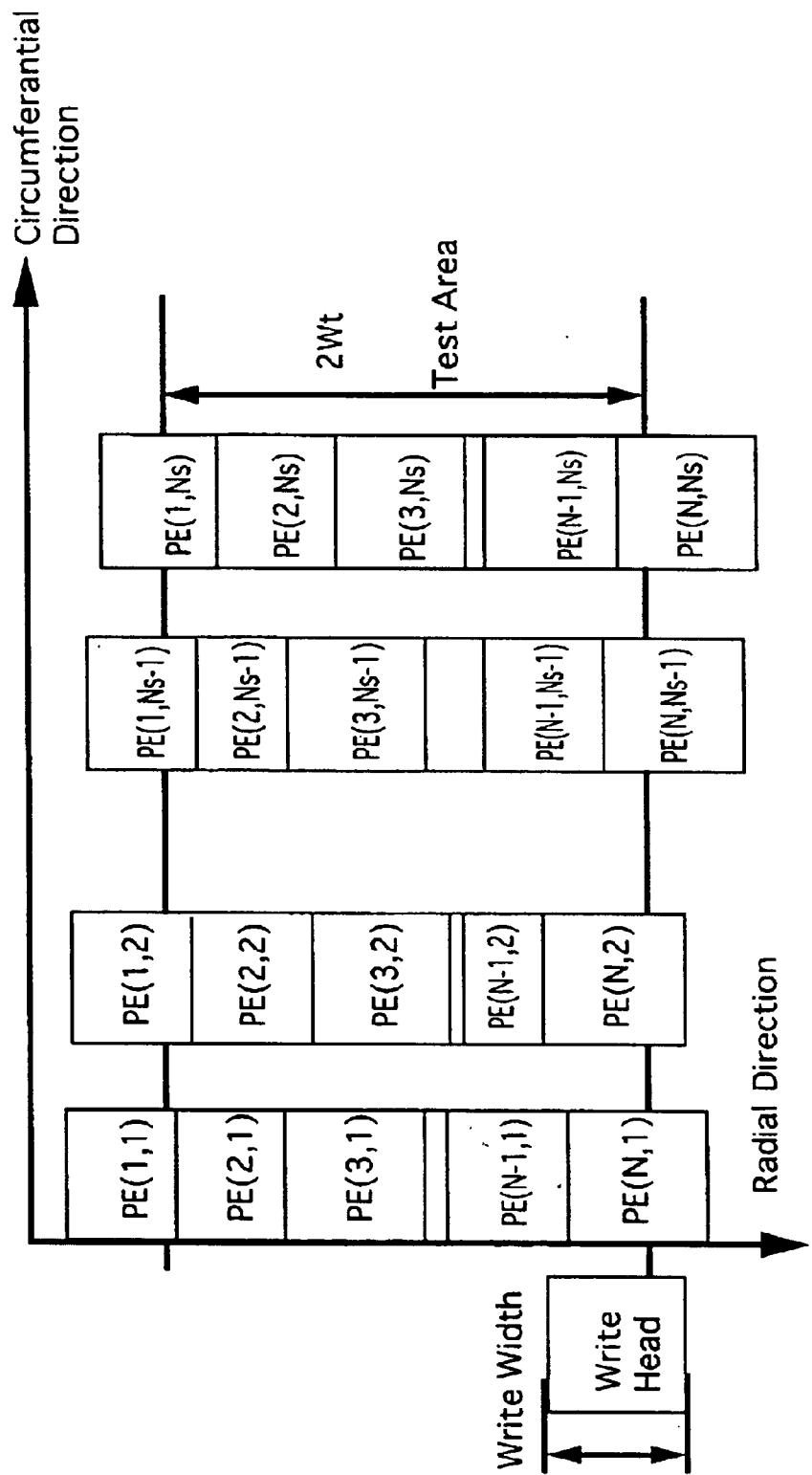
FIG. 10 is a schematic diagram of a magnetic disk surface when a pre-erasing operation is effective, in an embodiment of a testing method, according to the present invention.
Figure 11:
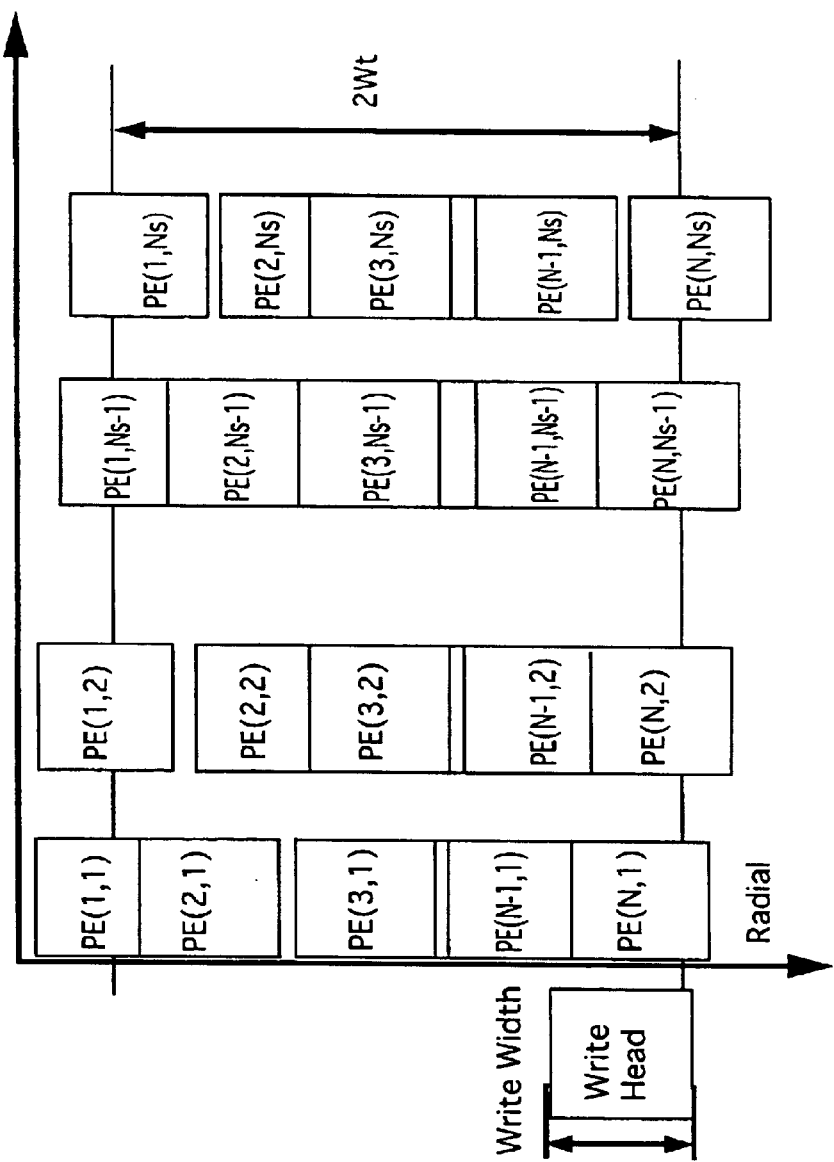
FIG. 11 is a schematic diagram of a magnetic disk surface when a pre-erasing operation fails, in an embodiment of a testing method, according to the present invention.

The flow chart of the pre-erasure operation is shown in FIG. 8; the state of the magnetic disk 111 is shown in FIG. 9; and a partially enlarged view of the pre-erased area is shown in FIGS. 10 and 11. The pre-erasure operation will be discussed in more detail below with reference to FIGS. 8 through 11.

As shown in the flow chart of FIG. 8, variable i is set to an initial value of 1 (S101), so that the magnetic head 121 is moved to the erasure target position via the spin stand 11 (S103).

The personal computer 16 erases the data of the data area of each sector by the magnetic head 121 via the read/write analyzer 15 and the FEE 12 and records the erasure position PE (i, t) at each erasure in the PS memory 26 using the format controller 14 (S105). Note that the variable i is an index of the erasure target position in the radial direction, and i=1, 2, . . . , N. The variable t represents the sector number (Ns) and t=1, 2 . . . , Ns. Upon reading the data, the index number t of each sector is automatically increased by the format controller 14.

When the data of a predetermined area for one track is completed, the variable i is incremented by one (i–i+1) (S105). If i is not greater than N, the magnetic head 121 is moved to the next erasure target position (S107, N; S103). Namely, the magnetic head 121 is moved in the radial direction by a predetermined pitch (length). The erasure position PE (i, t) is read from the magnetic disk 111 and is written in the PS memory 26, while erasing the data for one rotation of the disk.

The erasure operation mentioned above is repeated from i=1 to i=N while incrementing the value of i by one for N rotations of the disk.

When the erasure operation for N rotations is completed (i.e., if the value i is greater than N), whether or not the area to be tested in the erased area is valid is checked, and control is returned (S107; Y, S109). In the illustrated embodiment, an additional erasure operation is carried out for the area or sector which is not valid, so that the entire predetermined test area is made valid. If the area is not made valid even when a predetermined number of re-erasure operations is carried out, it is generally judged that the magnetic head 121 or the magnetic disk 111 is defective, and control ends. In the illustrated embodiment, if the area or the sector is not valid, the area or the sector is not used for the test.

The confirmation/judgment of the valid pre-erasure will be explained below. FIG. 10 shows the pre-erasure operation which has been carried out successfully for the overall test area, and FIG. 11 shows the pre-erasure operation which fails in a test area. In FIG. 11, there are non-erased area portions between the pre-erasure positions PE (2, 1) and PE (3, 1), between PE (1, 2) and PE (2, 2), between PE (1, Ns) and PE (2, Ns), and between PE (N–1, Ns) and PE (N, Ns). Namely, in the example of failure shown in FIG. 11, the erasure fails in the sectors t=1, 2, Ns.

Two preferred examples of actual pre-erasure positions PE (i, t) and algorithms to judge whether or not the pre-erasure is valid based on the measurement area are shown in FIGS. 12, 13, 14 and 15.

(Pre-Erasure Validity Confirming Algorithm 1)

Figure 12:
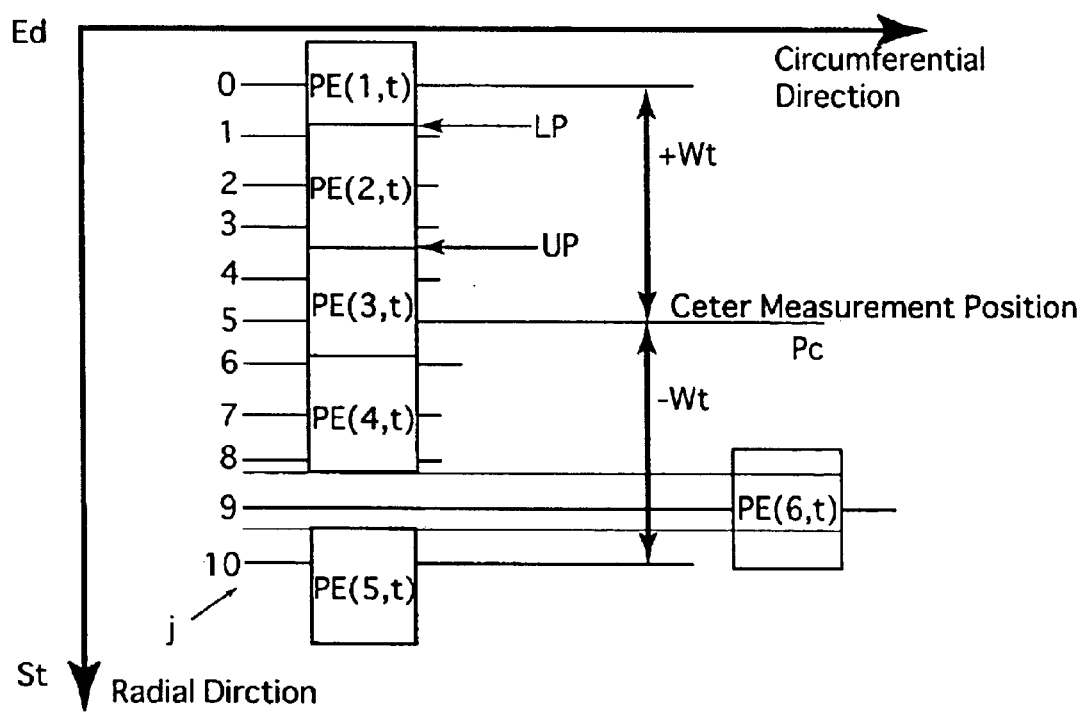
FIG. 12 is a schematic diagram of a first embodiment of an validity verification of a pre-erasing operation, according to the present invention.
Figure 13:
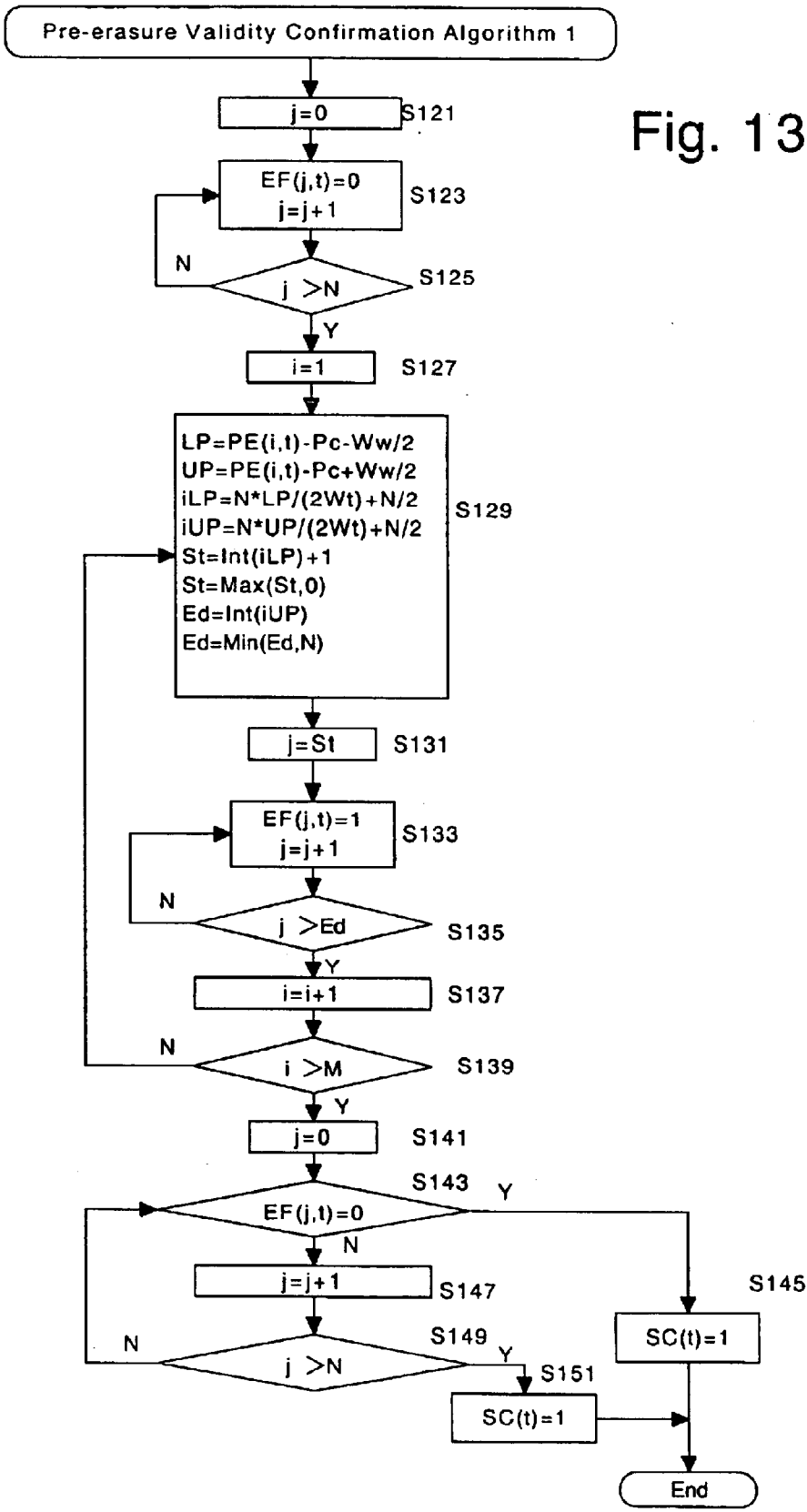
FIG. 13 is a flow chart of a first embodiment of an validity verification of a pre-erasing operation, according to the present invention.

Algorithm 1, which confirms the validity of the pre-erasure, is schematically shown in FIG. 12, and the flow chart of algorithm 1 is shown in FIG. 13. In this embodiment, the area (radial area) in which the validity of the exposure is checked is defined in the range of (Pc–Wt) through (Pc+Wt) in the radial direction about the center measurement position Pc, wherein 2Wt represents the set measurement area. In the validity confirming algorithm 1, the measurement area 2Wt is divided into N (0~N) areas (N–10 in FIG. 12). A pre-erasure judgment bit EF (j, t) ("0" is not erased and "1" is erased) is used as the erasure judgment bit at the position. All the pre-erasure judgment bits EF (j, t) which exist in the valid erasure area at a certain pre-erasure position PE (i, t) are set to "1".

The pre-erasure position PE (2, t) in FIG. 12 will be explained below by way of example. The bits of pre-erasure judgment bits EF (1, t), EF (2, t), EF (3, t) are "1". The pre-erasure operations mentioned above are repeated for all the pre-erasure positions PE (i, t). The pre-erasure process is considered a success if all the pre-erasure judgment bits EF (j, t) are "1", and is considered a failure if one or more of the pre-erasure judgment bits is "0". In case of the pre-erasure process failing, an additional erasure is carried out at the position j of the pre-erasure judgment bit EF (j, t) which is "0". In FIG. 12, since there is a non-erased area between the pre-erasure position PE (4, t) and PE (5, t), the additional erasure must be carried out at the position j=9. Therefore, in the embodiment shown in FIG. 12, the additional erasure is performed at the position j=9. This operation is repeated until the judgment result becomes valid. Thus, complete pre-erasure in the measurement area is carried out.

In the flow chart shown in FIG. 13, steps S121 through S125 represent a process for resetting the pre-erasure judgment bits EF(j, k) to zero. At steps S127 through S139, the M operations to check whether or not the pre-erasure area is valid are repeated (i=1 to M). LP and UP in the following expressions at step S129 represent the lower limit and the upper limit of the erasable range at the actual measurement position PE (i, t) of the erasure step i, wherein:

$$LP=PE(i, t)-Pc-Ww/2$$

$$UP=PE(i, t)-Pc+Ww/2$$

Thereafter, a lower limit St and an upper limit Ed of the index j of the pre-erasure judgment bit EF (j, t) corresponding to LP and UP are obtained, and pre-erasure judgment bits EF (j, t) in this range (from lower limit St to upper limit Ed) are all set to "1". When this operation is carried out for all the erasure steps i, the marking on pre-erasure judgment bit EF (j, t) is completed (S127 to S139).

The following expressions at step S129 are used to perform the algorithm to obtain St and Ed mentioned above:

$$iLP=N \times LP/(2Wt)+N/2;$$

$$iUP=N \times UP/(2Wt)+N/2;$$

$$St=Int(iLP)+1;$$

$$St=\text{Max}(St, 0);$$

$$St=\text{Min}(St, N);$$

$$Ed=Int(iUP);$$

$$Ed=\text{Min}(Ed, N);$$

$$Ed=\text{Max}(Ed, 0);$$

wherein Max (St, 0), Max (Ed, 0) represents the function that returns maximum value of St and 0, Ed and 0; Min (St, N), Min (Ed, N) represents the rotation minimum value of St and N, Ed and N; iLP and iUP are integers; and Int represents an operation to omit the digits below the decimal place.

Thereafter, an operation to check whether or not the incomplete pre-erasure area j exists is carried out for j=0 to N (S141, S143, S147, S149). If there is no incomplete pre-erasure area, a bit SC(t),which represents that the pre-erasure of the sector whose sector number is t is successful, is set to "1", and control ends (S149; Y, S151; End). If there is an incomplete pre-erasure area, the bit SC(t) is set to "0", and control ends (S143; Y, S145; End).

(Pre-Erasure Validity Confirming Algorithm 2)

Figure 14:
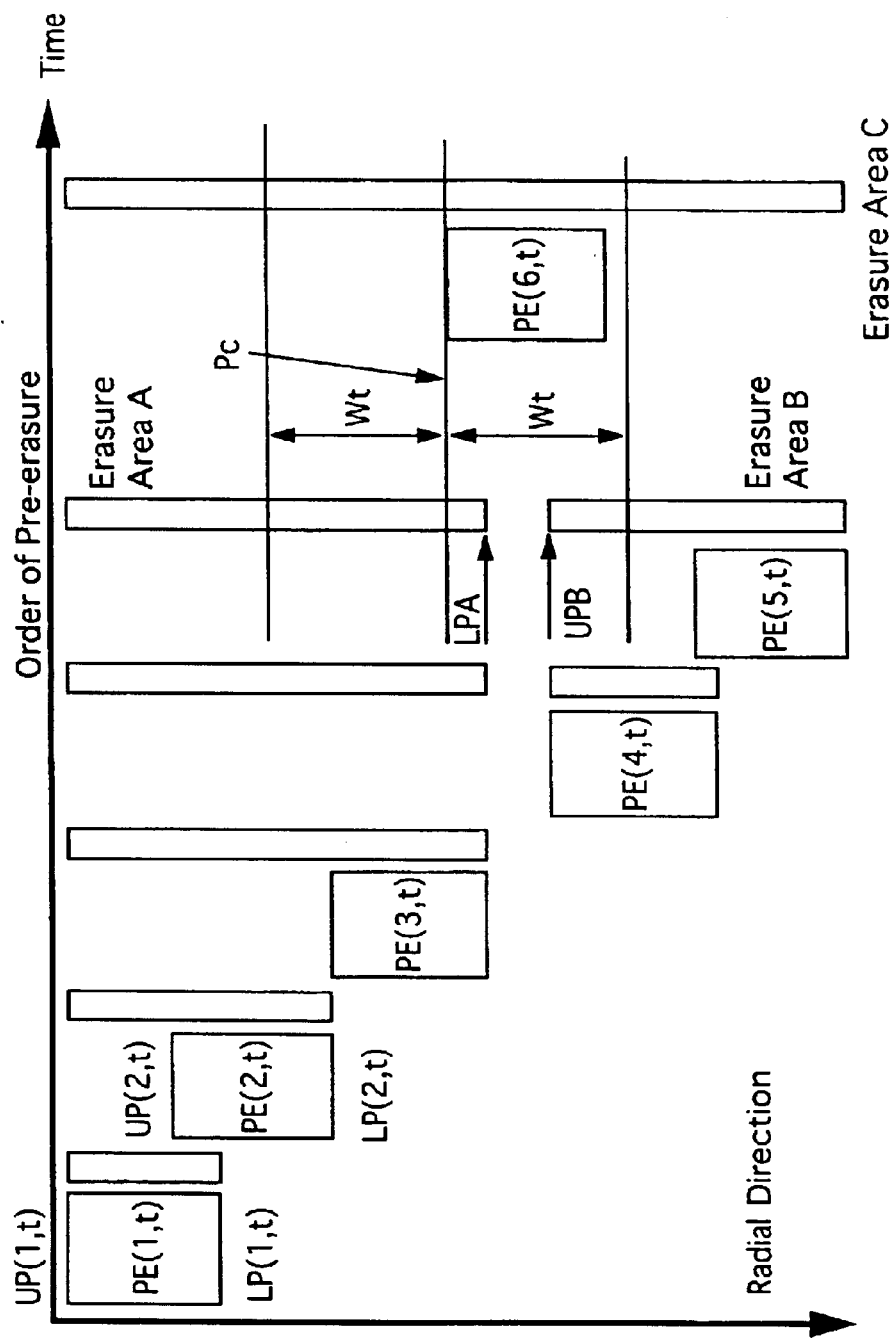
FIG. 14 is a schematic diagram of a second embodiment of an validity verification of a pre-erasing operation, according to the present invention.
Figure 15:
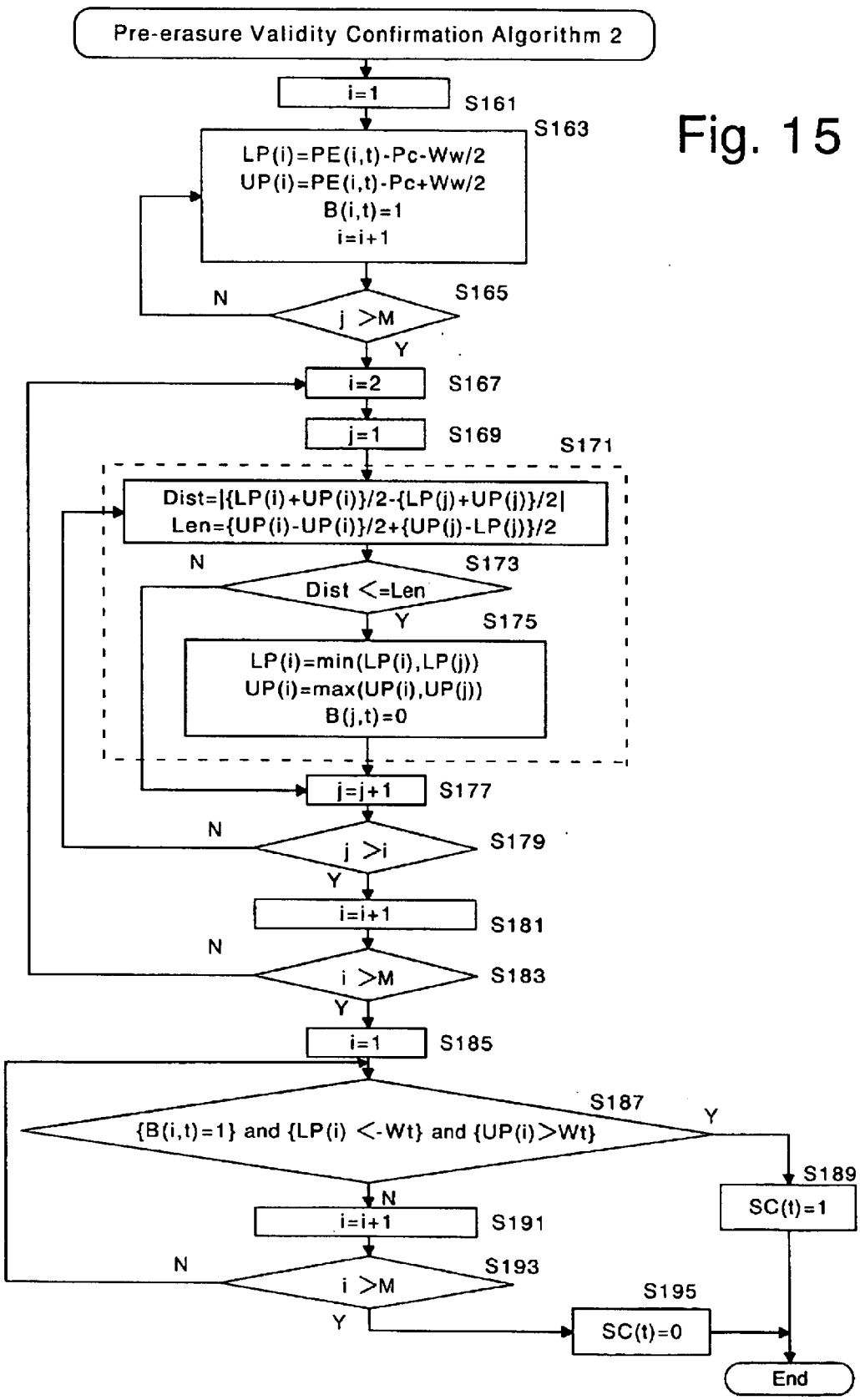
FIG. 15 is a flow chart of a second embodiment of an validity verification of a pre-erasing operation, according to the present invention.

Algorithm 2, which confirms the validity of the pre-erasure, is schematically shown in FIG. 14, and the flow chart thereof is shown in FIG. 15.

FIG. 14 shows the independent erasure areas which are varied in accordance with the progress of the pre-erasure (i is incremented) for a certain sector (t=1). In this embodiment, if the erasure areas overlap, they are combined and are shown as one erasure area. In FIG. 14, the ordinate represents the radial direction and the abscissa represents the time or sequence of the erasure step.

As shown in the example of FIG. 14, if the pre-erasure ends at i=5, erasure areas A and B independently exist. If the validity judgment is carried out, neither the erasure area A nor the erasure area B meet the measurement range solely. Therefore, the sector cannot be used. Consequently, an additional erasure is carried out, wherein the central position (LPA+UPB)/2 in a space between the erasure area A and the erasure area B and within the measurement range is a target position. As a result, the erasure area A and the erasure area B are combined into an erasure area C. As can be seen in FIG. 14, the erasure area C covers the measurement range. This judgment process is carried out on all the sectors t.

FIG. 15 is a flow chart of an area integration operation in one sector. First, the upper and lower limits UP(i) and LP(i) of the effective erasure area in the erasure area PE (i, t) are obtained, and the erasure area utilization bit B(i, t) is set to "1", which represents that the erasure area is utilized. These operations are repeated from i=1 to i=M (S161 through S165). The erasure area utilization bit B (i, t) is "1" when the erasure area is utilized and "0" when it is not utilized.

Thereafter, whether or not the erasure area PE (i, t) overlaps the next erasure area PE (i+1, t) is checked. If the PE (i, t) overlaps the PE (i+1, t), the integration operation to integrate the two areas is carried out from i=2 to i=M (S171 to S175). At step S171, Dist represents the absolute value of a difference between the central position of the effective erasure area of the i-th erasure area before integration and the central position of the effective erasure area of the j-th integrated area (i.e.=|(LP(i)+UP(i))/2−(LP(j)+UP(j))/2|), and Len represents (UP(i)−LP(i))/2+(UP(j)−LP(j))/2).

In this embodiment, if the two areas overlap (Dist≦Len), the smaller limit of the lower limits LP(i) and LP(j) is used as the lower limit LP(i) of the integrated area, and the greater limit of the upper limits UP(i) and UP(j) is used as the upper limit UP(i) of the integrated area (S173, Y; S175). The erasure area utilization bit B (j, t) of the integrated area is set to "0" to integrate the areas (S175).

The operations mentioned above are repeated until i is greater than M (step S183). In the embodiment shown in FIG. 14, the operations are repeated from i=1 to i=5. The area "A" is obtained by integrating the erasure areas PE (1, t), PE (2, t), and PE (3, t); and the area "B" is obtained by integrating the erasure areas PE (4, t) and PE (5, t) that have not been integrated in the area "A".

When the integration operations from S167 to S183 are completed, it is checked whether or not the last area (i.e., the integrated area of which erasure area utilization bit B(i, t) is set to "1") satisfies the measurement range. If the last area satisfied the measurement range, a bit SC(t), which represents that the pre-erasure of the sector whose sector number is t is successful, is set to "1" (S187; Y, S189). If the integrated area of which erasure area utilization bit B(i, t) is set to "1" does not satisfy the measurement range, the bit SC(t) is set to "0", and control ends (S187, N; S191 through S195).

In the embodiment of the erasure validity confirmation algorithm 2, if the bit SC(i) is set to "0", i.e., if no integrated area that satisfies the measurement range is obtained, the erasure is carried out at a target intermediate position between the lower limit LP of the integrated area and the upper limit UP of another integrated area, and the pre-erasure validity confirmation operation is carried out on the erased area, integrated area, and a newly raised area.

Step 2—Signal Writing Operation

Figure 16:
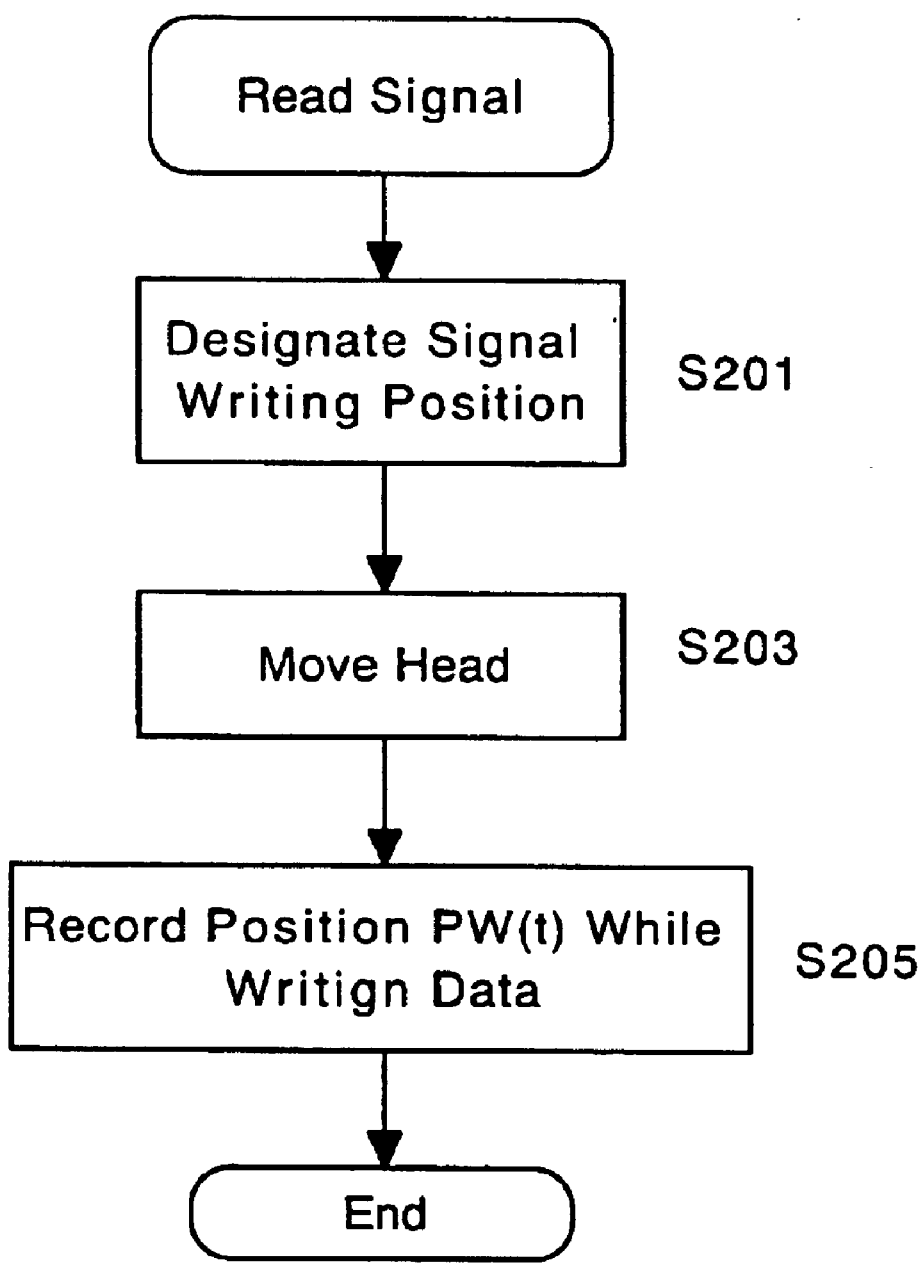
FIG. 16 is a flow chart of a signal writing operation in an embodiment of a track profile test method, according to the present invention.

If the pre-erasure is completed, the signal writing operation is carried out using a designated frequency (step S2 of FIG. 6). The flow chart of the signal writing operation is shown in FIG. 16.

First, a central position of the test area is designated (S201), and the magnetic head 121 is moved to the central position (S203). The signal of a designated frequency is written on the data area of the magnetic disk 111, and the actual writing position PW(t) is recorded in the PS memory 26 (S205).

Step 3—Signal Reading Operation

Thereafter, the signal is read by the magnetic head 121 while varying the position of the magnetic head 121 stepwise at a designated pitch (radial length) in the read designation area (step S3 of FIG. 6). The amplitude A (i, t) of the read signal is supplied to the personal computer 16 via the read/write analyzer 15, and the position information PR (i, t) of the magnetic disk 111 written in the areas SID and SB is recorded in the PS memory 26. The personal computer 16 reads the actual reading position PR(i, t) written in the PS memory 26, and uses the actual reading position PR(i, t) for various calculations. These operations are repeated while moving the magnetic head 121 to positions corresponding to i=1, 2, 3, . . . M at a predetermined pitch.

Figure 17:
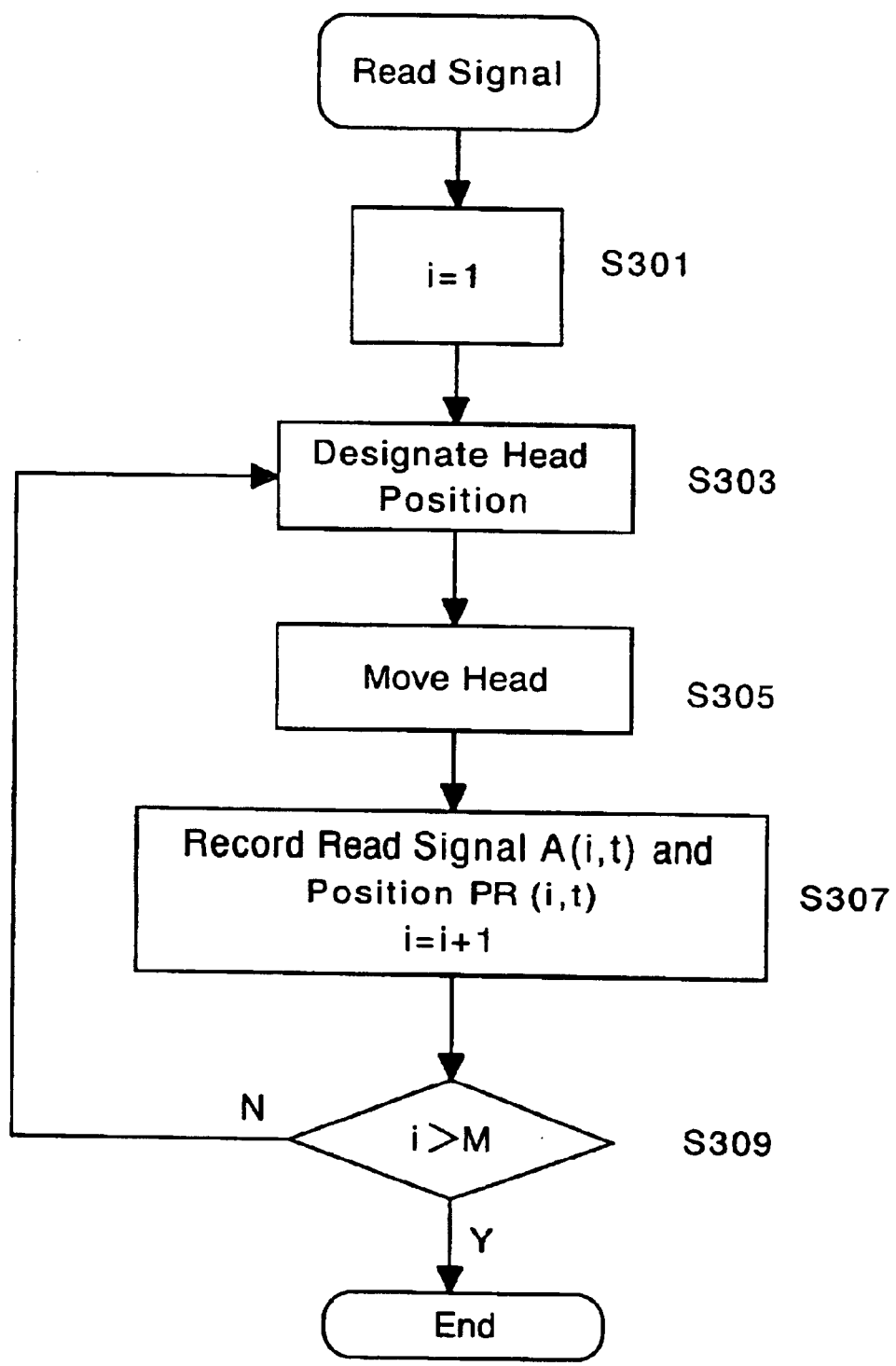
FIG. 17 is a flow chart of a signal reading operation in an embodiment of a track profile test method, according to the present invention.

The flow chart of the signal reading operation is shown in FIG. 17. The personal computer 16 sets the initial value of the variable i at "1" (S301), and moves the magnetic head 121 to the initial position represented by i=1 via the spin stand 11 (S303, S305). The data written on the magnetic disk 111 at step S2 of FIG. 6 is read for each sector from t=1 to Ns (S307). Upon reading the data, the amplitude A (i, t) is input to the personal computer 16, and the actual position data PR (i, t) of the magnetic disk 111 is written in the PS memory 26. The personal computer 16 reads the actual reading position PR (i, t) from the PS memory 26 to use the same in various calculations.

The above-mentioned operations are repeated by M times from i=1 to i=M, while increasing the value of i by one (S309; N, S303 through S307). When the M operations are completed, the control is returned (S309, Y).

Step 4—Calculation of Actual Distance

The personal computer 16 selects the sector numbers t (plural) in which the pre-erasure is valid, based on the recorded pre-erasure position PE (i, t) (step S4 of FIG. 6).

Figure 18:
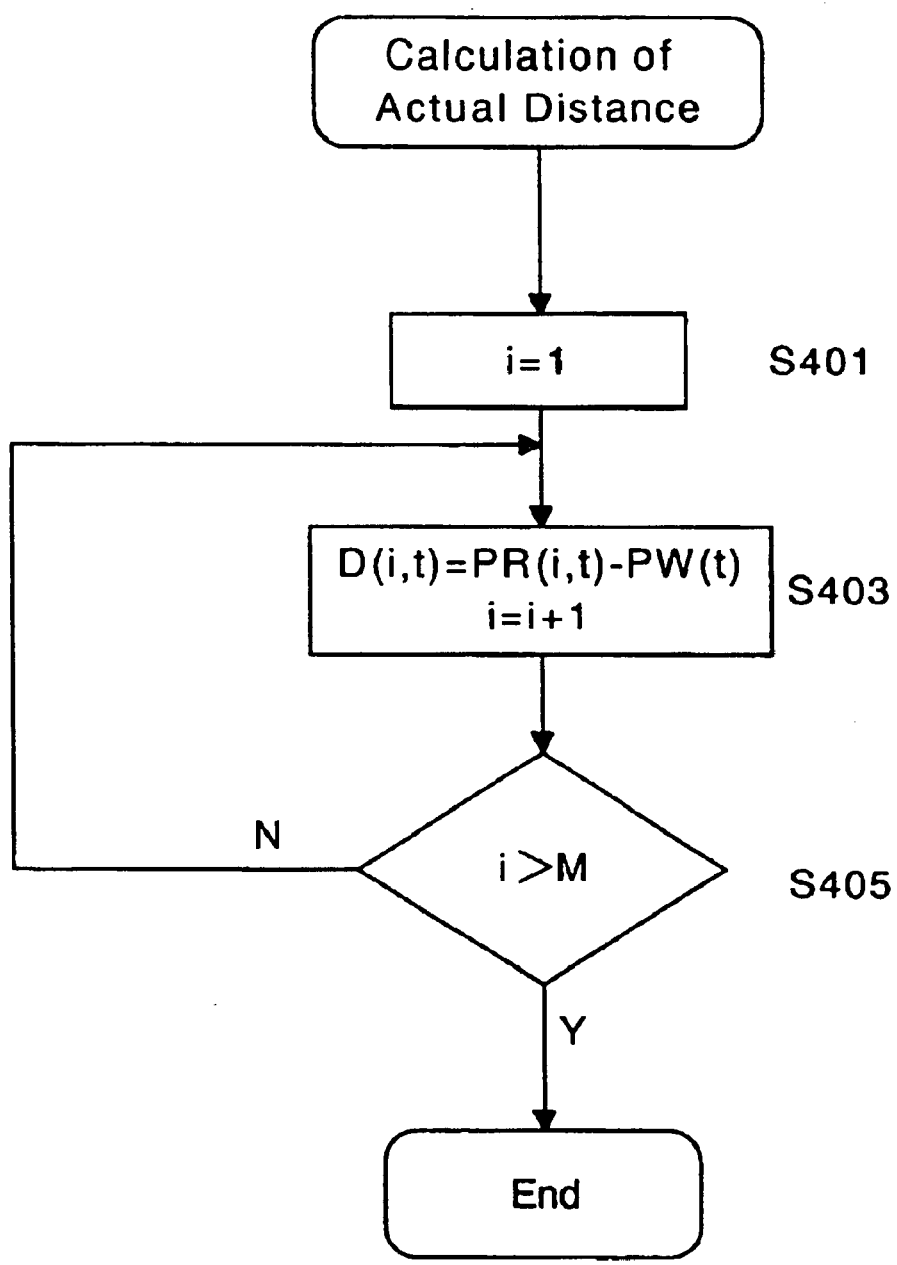
FIG. 18 is a flow chart of a calculating operation of an actual distance of a write head and a read head in an embodiment of a track profile test method, according to the present invention.
Figure 19:
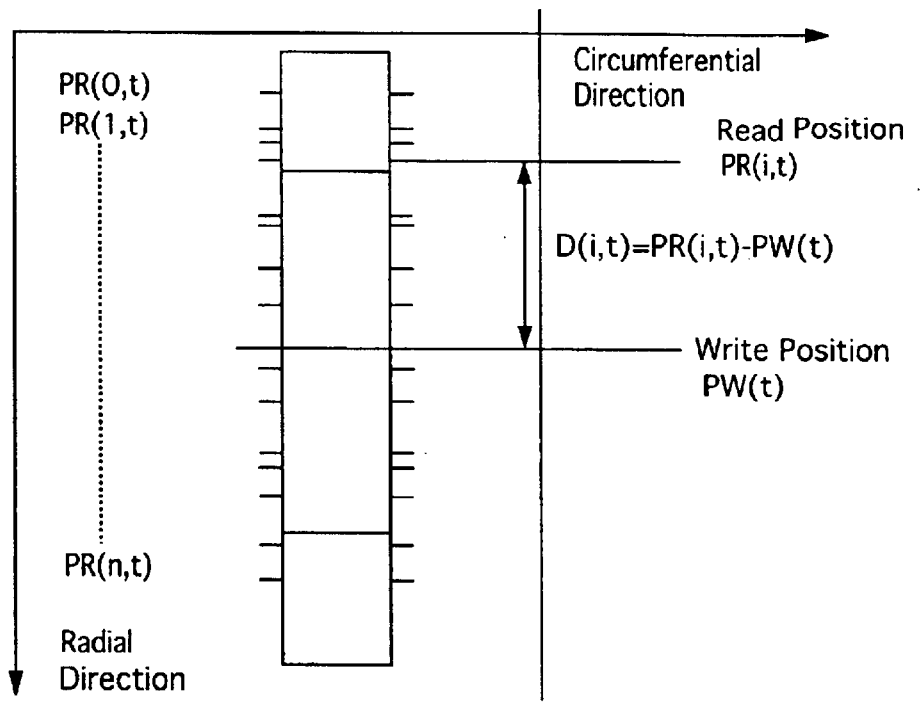
FIG. 19 is a schematic view of a magnetic disk recording surface when the actual distance between a write head and a read head is calculated, in a track profile test according to the present invention.

The flow chart to calculate the actual distance is shown in FIG. 18 and the state of the recording surface of the magnetic disk 111 is shown in FIG. 19. As shown in FIG. 18, the variable i is set to "1" (S401), and the actual distance D (i, t) in the radial direction between the write head and the read head is calculated using the following equation: D (i, t)=PR (i, t)−PW (t); and the variable i is incremented by one (S403). If i is less than or equal to M (i.e., if i>M is false), the control is returned to S403 to repeat the above-mentioned operations thereof (S405, N; S403). If i is greater than M, control is returned (S405, Y; End).

FIGS. 18 and 19 are related to the sector number t, and the calculations are repeatedly carried out for t=1, 2, . . . Nc.

Step 5—Calculation of Measurements of Track Profile

The Read/Write Offset, the Write Width Ww, and the Read Width Rw are calculated based on the relationship between the actual distance D (i, t) and the amplitude A (i, t). The calculation is carried out using, for example, a curve fitting method.

Figure 20:
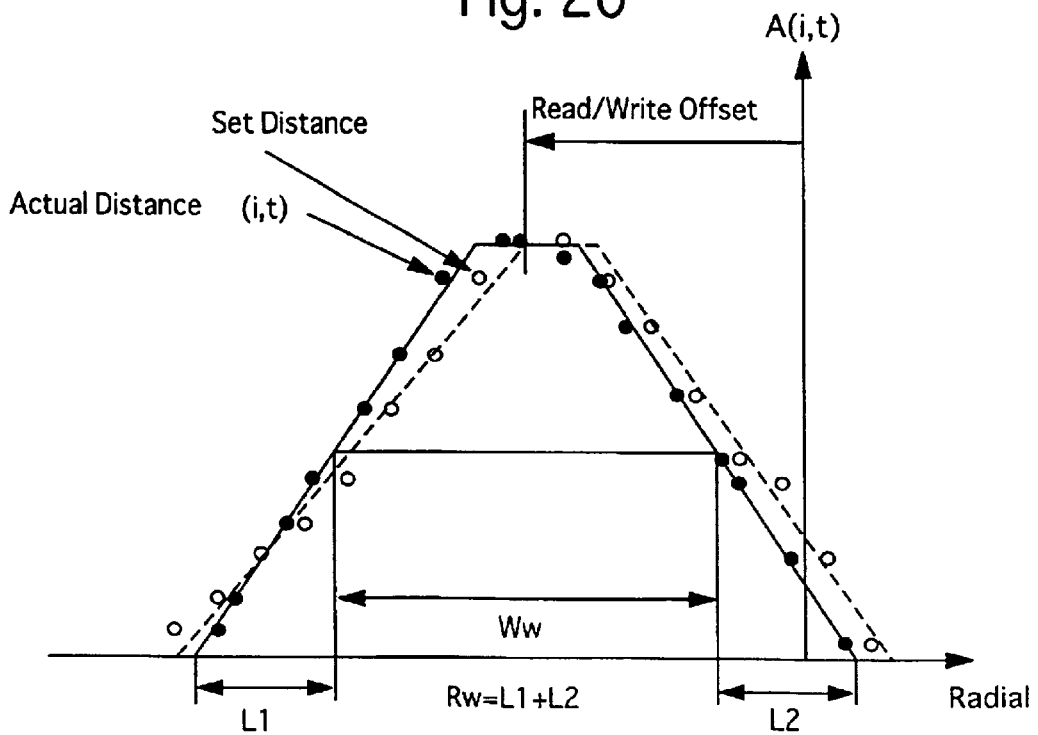
FIG. 20 is a graph showing the effect of a track profile test, in an embodiment of a track profile test method according to the present invention.

FIG. 20 shows a graph in which the actual distance D (i, t) and the amplitude A (i, t), obtained by the curve fitting method at the step 4, are plotted. In FIG. 20, the ordinate represents the amplitude A (i, t) and the abscissa represents the radial position. The set values represented by white dots are indicated by the ordinate, and the measurements of the actual distance D (i, t) represented by black dots are indicated by the abscissa. The fitting error in the case that the black dots are approximated by a trapezoid is extremely small in comparison with the case where the white dots are used. According to the present invention, precise measurements can be obtained.

In another embodiment of step 3, the designated pitch is increased (made coarse), so that the random or periodic swing of position is given upon reading the data to oscillate the magnetic head 121 in the radial direction to thereby reduce the number of reading operations. By causing the magnetic head 121 to swing, since the magnetic head 121 oscillates in a predetermined range, the same effect as the movement of the magnetic head 121 at a pitch smaller than the predetermined range can be obtained. With this method, the time for the track profile test can be reduced. Note that the swing of the magnetic head 121 can be attained by the PS swing circuit 25.

(Equivalent High Precision Positioning Method in Overwrite Test)

For test items which do not use the position data of the magnetic head 121 as a parameter as in an overwrite test, the tracking control is conventionally carried out so as to make the position of the read head coincident with the writing data track, as precisely as possible, using the read/write offset measured in the track profile test. However, in the conventional method, a positioning error is inevitably caused due to random swing (NRRO: non-repeatable run-out) of the spindle motor, the oscillation of the positioning mechanism, or the swing caused upon writing the position data using the servo track writer. The lower limit of the track width which can be tested by the magnetic head 121 is determined in accordance with the positioning error. In particular, the overwrite test is very sensitive to the positioning error, and hence, the accuracy of the test can be seriously reduced. Therefore, the maximum track density corresponding to the cyclic position precision of approximately 10 nm in the conventional method was approximately 200K TPI.

Figure 7:
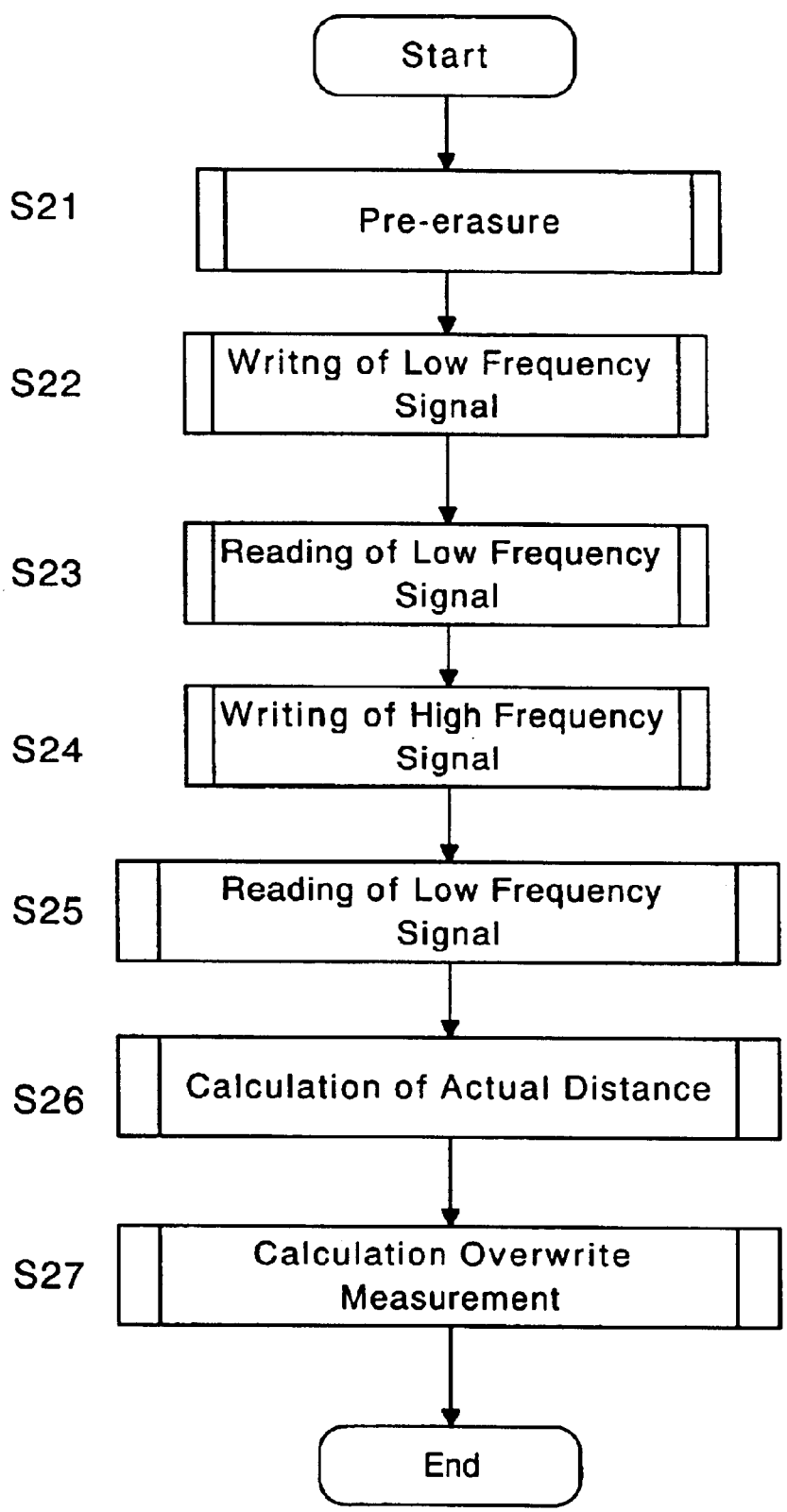
FIG. 7 is a flow chart of a second embodiment of a testing method, according to the present invention.

In a method of another embodiment of the present invention, high precision positioning (equivalent high precision positioning) is achieved by a spin stand having conventional mechanical precision. The equivalent high precision positioning in this embodiment will be explained below. The flow chart of this embodiment is shown in FIG. 7. Similar to the equivalent positioning algorithm in the track profile test show in FIG. 6, the equivalent high precision positioning method includes a pre-erasure operation (step S21), a signal writing operation (low frequency signal writing operation) (step S22), a signal reading operation (low frequency signal reading operation) (step S23), a high frequency signal writing operation (step S24), a high frequency signal reading operation (step S25), an actual distance calculation operation (step S26), and a measurement calculation operation (step S27). The pre-erasure operation and the signal writing operation are the same as the pre-erasure operation (S1) and the signal writing operation (S2) in the embodiment shown in FIG. 6. The signal reading operation is very similar to the signal reading operation (S3) in the embodiment shown in FIG. 6, expect that the read position is set to be identical to the writing position plus read error (read/write offset), so that the magnetic head 121 is moved accordingly to read the data, and in that the measurement is carried out at only one position, since the positioning data is not used as a parameter.

Step S21—Pre-Erasure Operation

Step S21 is basically the same as the operation of step S1; however, it is possible to reduce the erasure step number N and the test range, in comparison with the track profile test mentioned above. This is because the positioning error data is not used as a parameter.

Step S22—Low Frequency Signal Writing Operation

Step S22 is basically the same as step S2; however, the frequency of the signal to be written is an LF (low frequency) component. Moreover, the actual writing position PWLF (i, t) is recorded in the PS memory 26.

Step S23—Low Frequency Signal Reading Operation

Step S23 is basically the same as the step S3. The reading position is only one. The reading position is set at a position determined by adding the read/write offset (reading position deviation) to the target writing position designated at step S22. An amplitude ALFB(t) of the LF component is measured by the magnetic head 121 and the spectrum analyzer at the set position, and is recorded in the personal computer 16. The actual reading position PRB (t) is recorded in the PS memory 26.

Step S24—High Frequency Signal Writing Operation

Step S24 is basically the same as the signal writing operation at step S2. However, the frequency of the signal to be written is an HF (high frequency) component. The actual writing position PWHF (t) is recorded in the PS memory 26.

Step S25—Low Frequency Signal Reading Operation

Step S25 is basically the same as the low frequency signal reading operation of step S23. The position to be read is only one. The reading position is set at a position determined by adding the read/write offset (reading position deviation) to the target writing position designated at step S22. The amplitude ALFA(t) of the LF component is measured by the magnetic head 121 and the spectrum analyzer at the set position and is recorded in the personal computer 16. The actual reading position PRA (t) is recorded in the PS memory 26.

Step S26—Calculation of Actual Distance

In step S26, the values D3($t$), D4($t$), D5($t$) which represent the actual positional relationship (positioning error) of the magnetic head 121 at steps S23, S24 and S25 with respect to the PWLF (t) stored at step S22 are given by:

$$D3(t)=PRB(t)-PwLF(t)-\text{Read/Write offset}$$

$$D4(t)=PwHF(t)-PwLF(t)$$

$$D5(t)=PRA(t)-PwLF(t)-\text{Read/Write offset}$$

D3($t$), D4($t$) and D5($t$) are selected within a predetermined threshold value.

Figure 21:
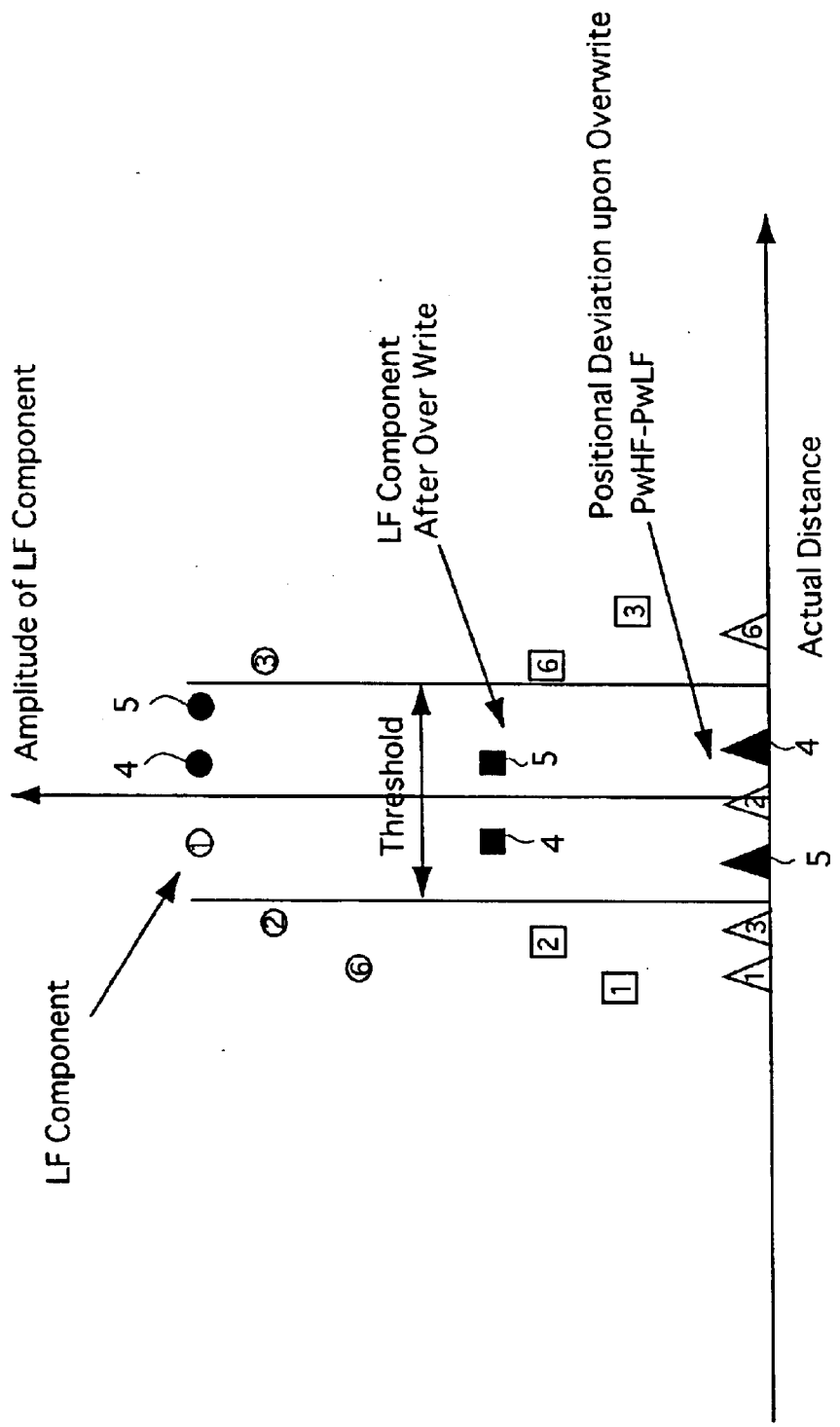
FIG. 21 is a graph showing the judgment of a positioning error in an overwrite test according to the present invention.

FIG. 21 shows a relationship of the positioning error at each operation in the overwrite test. In FIG. 21, the abscissa represents the positioning error, and the ordinate represents the width of the measurement of the LF component in connection with steps S23 and S25. The ordinate does not represent anything in connection with step S24. Moreover, the symbols "○", "Δ" and "□" represent the measurements at step S23, step S24 and step S25, respectively. Furthermore, the numerals indicated with the symbols "○", "Δ" and "□" designate the sector numbers thereof.

Step S27—Calculation of Overwrite Measurement

In step S27, measurements are used for the sectors of which the positioning error at each operation, calculated at step S26, is within a predetermined threshold value. As can be seen in FIG. 21, the sectors in which all the measurements are within the threshold value are sector No. 4 and No. 5. Consequently, the values of the sector No. 4 and No. 5 can be used to calculate the measurements. Using the measurements of the effective sectors, the statistical operation (mean value, standard deviation, etc.) is performed by a method per se known, to obtain test results.

Step S27—Alternative Calculation Method of Overwrite Measurements

In the overwrite test, the magnitude of the residual LF components varies depending on the positioning error s between the HF writing operation (step S24) and the LF writing operation (step S22) and between the reading operation (steps 23, 25) and the LF writing operation (step S22). Namely, the positioning error upon the HF writing operation (step S24) exhibits a V-shaped change in the amplitude and the positioning error upon reading operation (step S25) exhibits a trapezoid-shaped change in the amplitude. The positioning error upon the reading operation (step S23) exhibits a trapezoidal change in the amplitude, but this is a denominator of the overwrite measurement. In view of this, all the sectors in which the erasure is valid are used to carry out the curve fitting to thereby make it possible to conduct an extremely high precision overwrite test.

As can be understood from the foregoing, according to the embodiment of the present invention, a more accurate positioning than the accuracy of the tracking control of the spin stand 11 or the accuracy of the servo track writing can be achieved.

Although the above discussion has been addressed to a test of a single magnetic head 121, the present invention can be applied to a head stack assembly having a plurality of magnetic heads mounted thereto. In this application, a plurality of magnetic disks are provided and the above-mentioned test method is carried out for the recording surface of each magnetic disk and for each magnetic head. Moreover, although the subject to be tested is the magnetic head 121 in the embodiment discussed above, it is possible to test the magnetic disk 111 by replacing the magnetic head 121 with a reference magnetic head.

As can be understood from the above discussion, according to the present invention, since the area information written in the magnetic disk 111 and the magnetic head position information are recorded in the PS memory 26 and are used when the erasure, writing, and reading are carried out for a predetermined area of the magnetic disk 111 by the magnetic head 121 to be tested, a high precision positioning can be substantially carried out, independently of the precision of the tracking control of the magnetic disk tester and the servo track writing precision. Consequently, the application of the testing apparatus or testing method of the present invention on a mechanical apparatus having the conventional precision makes it possible to achieve a higher precision measurement than conventional mechanical precision.

The limit of accuracy in the present invention is not related to an absolute accuracy of the sector servo information data embedded in a data surface of the magnetic disk 111, but is related to a cyclic (repetitive) accuracy. Accordingly, since the accuracy at least identical to or more accurate than the track density of the HDD products can be obtained, the accuracy of the measurement of the testing apparatus can be dramatically enhanced.

Moreover, according to the present invention, the time necessary to carry out the test, such as a track profile test, can be remarkably shortened.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. A testing apparatus for one of a magnetic head and a magnetic disk, comprising:

a magnetic disk which rotates at a predetermined constant rotational speed;

a magnetic head moving mechanism which holds a magnetic head and which moves the magnetic head to a predetermined position in a radial direction of the magnetic disk;

a movement mechanism control device for driving the magnetic head moving mechanism, wherein said movement mechanism control device moves said magnetic head moving mechanism to a predetermined radial position corresponding to position data referenced from position data from movement of the head in the radial direction and position data embedded in the surface of the magnetic disk;

a read/write control device for writing a predetermined magnetic signal on the magnetic disk using the magnetic head, and for reading a magnetic signal of the magnetic disk using the magnetic head; and a memory for storing therein position data embedded in a data surface of said magnetic disk, extracted from the magnetic signal which is read by the read/write control device, for storing an actual writing position, per sector of said magnetic disk, at the time of writing said predetermined magnetic signal by said read/write control device, and for storing an actual reading position, per said sector of said magnetic disk, at the time of reading said magnetic signal of the magnetic disk; and a device for calculating a difference between said actual reading position and said actual writing position in order to obtain a read/write offset, a write width, and a read width.

2. A testing method for testing one of a magnetic head and a magnetic disk for a testing apparatus comprising a magnetic disk which rotates at a predetermined constant rotation speed; a magnetic head moving mechanism which holds a magnetic head and moves the magnetic head to a predetermined position in a radial direction of the magnetic disk;

a movement mechanism control device for driving the magnetic head moving mechanism, wherein said movement mechanism control device moves said magnetic head moving mechanism to a predetermined radial position corresponding to position data referenced from position data from movement of the head in the radial direction and position data embedded in the surface of the magnetic disk; a read/write control device for writing a predetermined signal on the magnetic disk using the magnetic head and for reading the magnetic signal of the magnetic disk using the magnetic head; and a memory for storing therein position data embedded in a data surface of said magnetic disk, extracted from the magnetic signal read from said magnetic disk; said testing method comprising:

storing the position data embedded in the data surface upon read/write operation of data onto the magnetic disk by the magnetic head; and utilizing the position data which is stored in the memory;

wherein when the read/write operation of the data from/on the magnetic disk by the magnetic head is carried out by the magnetic head, the magnetic head moving mechanism is driven to move and follow the magnetic head so that the position information embedded in the data surface, read and extracted from the magnetic disk by the magnetic head is identical to a predetermined target position.

3. The testing method for testing one of a magnetic head and a magnetic disk, according to claim 2, wherein said testing method is applied to a track profile test, said testing method comprising:

a pre-erasure step in which the magnetic head is moved to a predetermined test position in the radial direction by the magnetic head moving mechanism, so that each sector data in a predetermined test range of tracks of a predetermined format on the magnetic disk by the magnetic head which has been moved to the predetermined test position is erased, the erasure operations being repeatedly carried out at a plurality of positions while moving the magnetic head at a predetermined pitch in the radial direction;

a signal writing step in which the magnetic head is moved to a substantially central position in the radial direction, of the test range which has been subjected to the erasure operation, so that a predetermined signal is written in the sector of the test range at the substantially central position; and a signal reading step in which the signal written in the sector in the predetermined test range is read while moving the magnetic head at a predetermined pitch, within a predetermined radial range on opposite sides of the substantially central position in the radial direction, through the magnetic head moving mechanism.

4. The testing method for testing one of a magnetic head and a magnetic disk according to claim 3, wherein said pre-erasure step comprises:

checking whether the pre-erasure is valid, by successively marking the radial areas which have been subjected to erasure, for the circumferential area of each sector of the measurement range included in the test area which has been subjected to the pre-erasure included in the test range, based on the position data stored at each erasure step; and erasing the radial area by moving the magnetic head to the radial area which is not valid in the case where the pre-erasure of the radial areas is not invalid.

5. The testing method for testing one of a magnetic head and a magnetic disk according to claim 3, wherein said pre-erasure step comprises:

checking whether the radial areas that have been subjected to erasure overlap, for the circumferential area of each sector of the measurement range included in the test area which has been subjected to the pre-erasure included in the test range, based on the position data stored at each erasure step; and wherein in the case where the radial areas overlap, the radial areas are deemed to be one radial area; and in the case where the circumferential data areas of the sectors within the measurement area are not integrated into one radial erasure area, the magnetic head is moved to an area between the radial areas which do not overlap, so that a predetermined signal is written in the radial area to thereby integrate the circumferential data areas of the sectors within the measurement area into one radial erasure area.

6. The testing method for testing one of a magnetic head and a magnetic disk according to claim 2, said testing method comprising:

a pre-erasure step in which the magnetic head is moved to a predetermined test position in the radial direction by the magnetic head moving mechanism, so that each sector data in a predetermined test range of tracks of a predetermined format on the magnetic disk by the magnetic head which has been moved to the predetermined test position is erased, said erasure operations being repeatedly carried out at a plurality of positions while moving the magnetic head at a predetermined pitch in the radial direction;

a signal writing step in which the magnetic head is moved to a target position in the radial direction, of the test range which has been subjected to the erasure operation, so that a low frequency signal is written in the sectors of the test range;

a low frequency signal reading step in which the low frequency signal written in the sectors in the predetermined test range is read by the magnetic head which is moved through the magnetic head moving mechanism to a position which is determined taking into account the target position and a read/write offset of the magnetic head, wherein the amplitude of the read low frequency signal is stored in the memory;

a high frequency signal writing step in which the magnetic head is moved by the magnetic head moving mechanism to a position which is determined taking into account the target position and the read/write offset of the magnetic head to write the high frequency signal in the sectors within the predetermined test range;

a high frequency signal reading step in which the high frequency signal written in the predetermined test range is read by the magnetic head which is moved through the magnetic head moving mechanism to a position which is determined taking into account the target position and a read/write offset of the magnetic head; and a data selection step in which effective sectors are selected based on the position data of the signal read at each of the signal reading steps.

7. The testing method for testing one of a magnetic head and a magnetic disk according to claim 2, wherein a signal reading step includes moving the magnetic head in one of cyclically and irregularly in the radial direction by providing a predetermined swing to the magnetic head moving mechanism.

8. The testing method for testing one of a magnetic head and a magnetic disk according to claim 2, further comprising a calculation step to obtain a radial deviation between the writing operation and the reading operation, based on the position information of the magnetic head which has been judged to be valid in the pre-erasure validity checking operation and the read signal information corresponding to the magnetic head position information.

9. The testing method for testing one of a magnetic head and a magnetic disk according to claim 2, comprising servo-writing the data on the magnetic disk which rotates at a speed at which less aperiodic deviation occurs, via one of a reference magnetic head and the magnetic head, in a predetermined range larger than the radial test area the magnetic disk, prior to a pre-erasure step.

10. The testing method for testing one of a magnetic head and a magnetic disk according to claim 2, wherein the magnetic head comprises a plurality of magnetic heads in the form of a head stack assembly.

11. A testing method for testing one of a magnetic head and a magnetic disk for a testing apparatus comprising a magnetic disk which rotates at a predetermined constant rotation speed; a magnetic head moving mechanism which holds a magnetic head and moves the magnetic head to a predetermined position in a radial direction of the magnetic disk;

a movement mechanism control device for driving the magnetic head moving mechanism, wherein said movement mechanism control device moves said magnetic head moving mechanism to a predetermined radial position corresponding to position data referenced from position data from movement of the head in the radial direction and position data embedded in the surface of the magnetic disk; a read/write control device for writing a predetermined signal on the magnetic disk using the magnetic head and for reading the magnetic signal of the magnetic disk using the magnetic head; and a memory for storing therein position data embedded in a data surface of said magnetic disk, extracted from the magnetic signal read from said magnetic disk; said testing method comprising:

storing the position data embedded in the data surface upon read/write operation of data onto the magnetic disk by the magnetic head;

utilizing the position data which is stored in the memory; and calculating a radial deviation between the writing operation and the reading operation, based on the position information of the magnetic head which has been judged to be valid in a pre-erasure validity checking operation and read signal information corresponding to the magnetic head position information;

wherein when the read/write operation of the data from/on the magnetic disk by the magnetic head is carried out by the magnetic head, the magnetic head moving mechanism is driven to move and follow the magnetic head so that the position information embedded in the data surface, read and extracted from the magnetic disk by the magnetic head is identical to a predetermined target position.

* * * * *